United States Patent
Konishi

(10) Patent No.: US 8,049,547 B2
(45) Date of Patent: Nov. 1, 2011

(54) SEMICONDUCTOR INTEGRATED CIRCUIT AND SIGNAL ADJUSTING METHOD

(75) Inventor: Kenichi Konishi, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/712,672

(22) Filed: Feb. 25, 2010

(65) Prior Publication Data

US 2010/0219869 A1    Sep. 2, 2010

(30) Foreign Application Priority Data

Feb. 27, 2009    (JP) .................................. 2009-046508
Sep. 17, 2009    (JP) .................................. 2009-215675

(51) Int. Cl.
*H03K 3/013* (2006.01)

(52) U.S. Cl. .......................... 327/291; 327/292; 327/298

(58) Field of Classification Search ........................ None
See application file for complete search history.

(56) References Cited

U.S. PATENT DOCUMENTS

| | | | | |
|---|---|---|---|---|
| 5,491,442 A | * | 2/1996 | Mirov et al. | 327/295 |
| 6,947,493 B2 | * | 9/2005 | Cohen et al. | 375/295 |
| 7,315,270 B2 | * | 1/2008 | Maksimovic et al. | 341/157 |
| 2008/0129341 A1 | | 6/2008 | Mochizuki | |

FOREIGN PATENT DOCUMENTS

JP    2008-141013 A    6/2008

* cited by examiner

*Primary Examiner* — An Luu

(74) *Attorney, Agent, or Firm* — Arent Fox, LLP

(57) ABSTRACT

A semiconductor device includes a first signal generator that generates a plurality of second signals having a delay relative to a first signal and having states that change at different timings. A second signal generator generates a third signal having a delay relative to the first signal. A detector detects a delay amount based on the states of the second signals when a state of the third signal changes. The first signal generator and the second signal generator are different from each other in an amount of change in delay relative to a change in an operating state.

19 Claims, 29 Drawing Sheets

SEMICONDUCTOR INTEGRATED CIRCUIT AND SIGNAL ADJUSTING METHOD

CROSS-REFERENCE TO RELATED APPLICATION

This application is based upon and claims the benefit of priorities of the prior Japanese Patent Application No. 2009-046508, filed on Feb. 27, 2009 and the prior Japanese Patent Application No. 2009-215675, filed on Sep. 17, 2009, the entire contents of which are incorporated herein by reference.

FIELD

The embodiments discussed herein relate to semiconductor integrated circuits and signal adjusting methods.

BACKGROUND

A semiconductor device that is intended to overcome a problem of local characteristic variations has been known. For example, Japanese Unexamined Patent Application Publication No. 2008-141013 discloses a semiconductor device having a plurality of sensor circuits that are arranged evenly therein to detect local characteristic variations at their respective positions as delay information and an output interface circuit that collects the delay information detected by the sensor circuits and outputs the collected information. In addition, the semiconductor device has, at its outside, an arithmetic operating section that statistically processes the detected delay information and generates a control code by determining conditions such as variations in the manufacturing process and so on, an output voltage controller that determines a voltage to be output in accordance with a control code recorded in a nonvolatile memory, and a power supply voltage generator that supplies a power-supply voltage and a ground potential to the semiconductor device.

In the related art, however, there is a problem in that a slew rate, a signal delay, and so on cannot be controlled based on a result of detection of changes in operating conditions such as a voltage and a temperature of a circuitry. In addition, the semiconductor device of the related art requires a large number of sensor circuits, a circuit for supplying clock signals having different phases to a plurality of sensor circuits, and a circuit for generating a test signal. Thus, there are problems in that the circuit configuration is complicated and the circuit scale is increased.

SUMMARY

According to an aspect of the embodiments, a semiconductor device includes a first signal generator that generates a plurality of second signals having a delay relative to a first signal and having states that change at different timings, a second signal generator that generates a third signal having a delay relative to the first signal, and a detector that detects, when a state of the third signal changes, a delay state of a signal based on the states of the second signals, wherein the first signal generator and the second signal generator are different from each other in an amount of change in delay relative to a change in an operating state.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE EMBODIMENTS

A semiconductor integrated circuit and a signal adjusting method according to preferred embodiments will be described below in detail with reference to the accompanying drawings.

Figure 1:
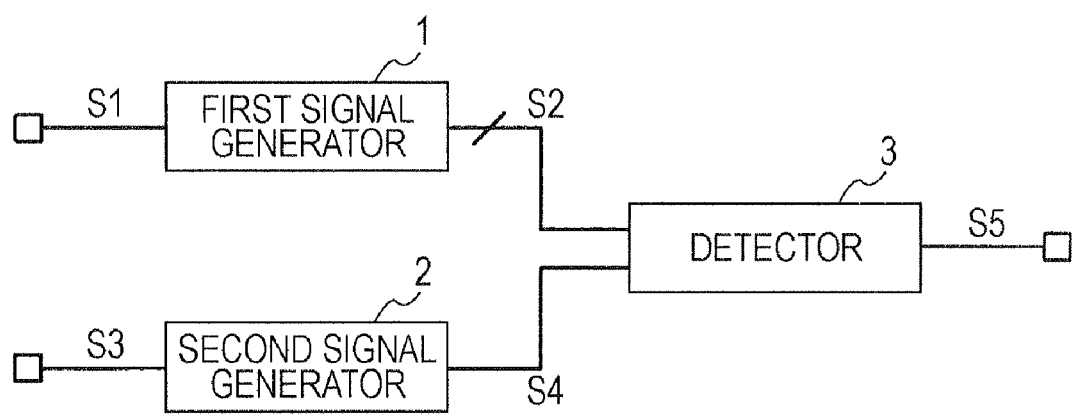
FIG. 1 illustrates a semiconductor integrated circuit according to a first embodiment.

FIG. 1 is a block diagram of a semiconductor integrated circuit according to a first embodiment. As illustrated in FIG. 1, the semiconductor integrated circuit includes a first signal generator 1, a second signal generator 2, and a detector 3. The first signal generator 1 and the second signal generator 2 are different from each other in the amounts of changes in delay relative to changes in operating conditions. For example, the first signal generator 1 has a smaller amount of change in delay relative to changes in operating conditions than the second signal generator 2. Examples of the operating conditions include a voltage and a temperature in a circuitry. When process conditions during manufacture of the semiconductor integrated circuit vary, the on-resistances and the threshold values of the transistors vary. When the on-resistances and the thresholds vary, the amount of delay also varies. Thus, variations in the process conditions are also included in the changes in the operating conditions.

The first signal generator 1 delays a first signal S1 to generate a plurality of second signals S2. The individual second signals S2 go from relatively high (H) to relatively low (L) or go from low (L) to high (H) at different timings. The second signal generator 2 delays a third signal S3 to generate a fourth signal S4. The third signal S3 may be a signal that changes at the same timing as the first signal S1 or may be the same signal as the first signal S1. The detector 3 detects the states of the second signals S2 at the timing at which the fourth signal S4 goes from high (H) to low (L) or the timing at which the fourth signal S4 goes from low (L) to high (H). The detector 3 then detects the states of signal delay based on the states of the second signals S2 and outputs a detection signal S5.

Figure 2:
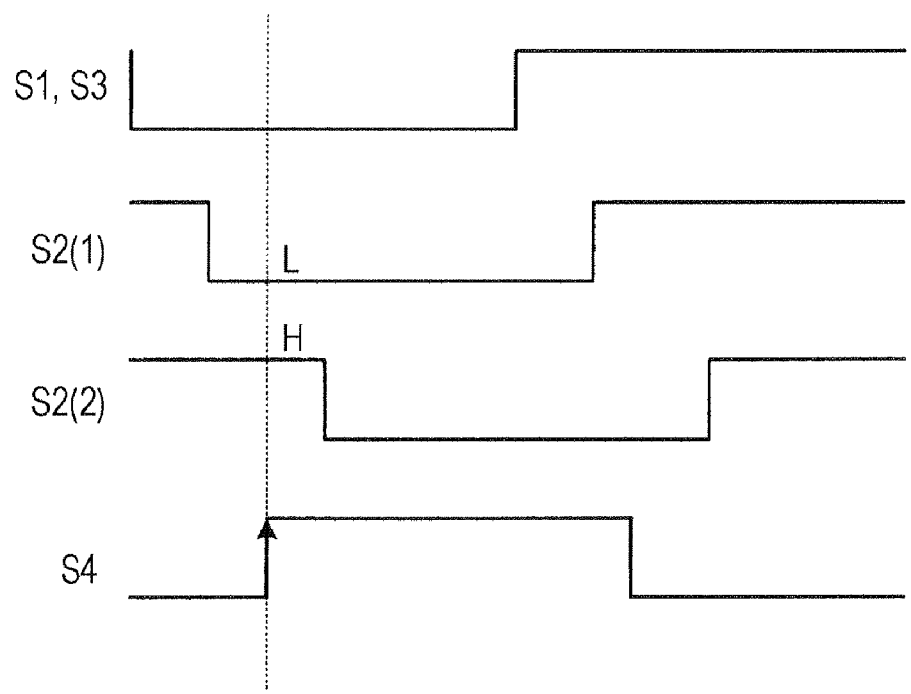
FIG. 2 illustrates an operation of the semiconductor integrated circuit according to the first embodiment.
Figure 3:
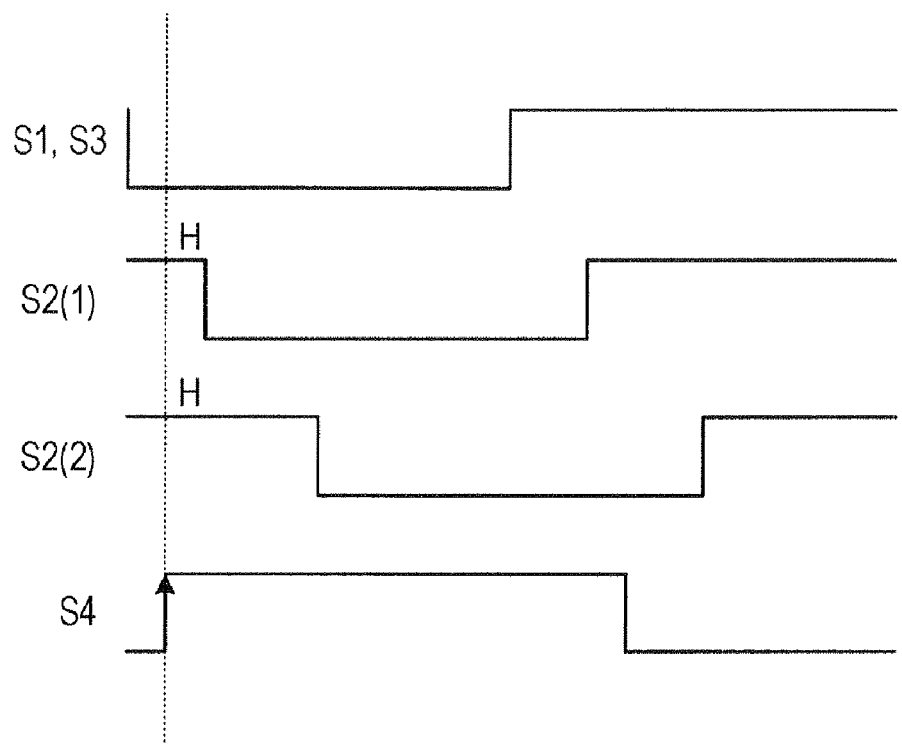
FIG. 3 illustrates an operation of the semiconductor integrated circuit according to the first embodiment.
Figure 4:
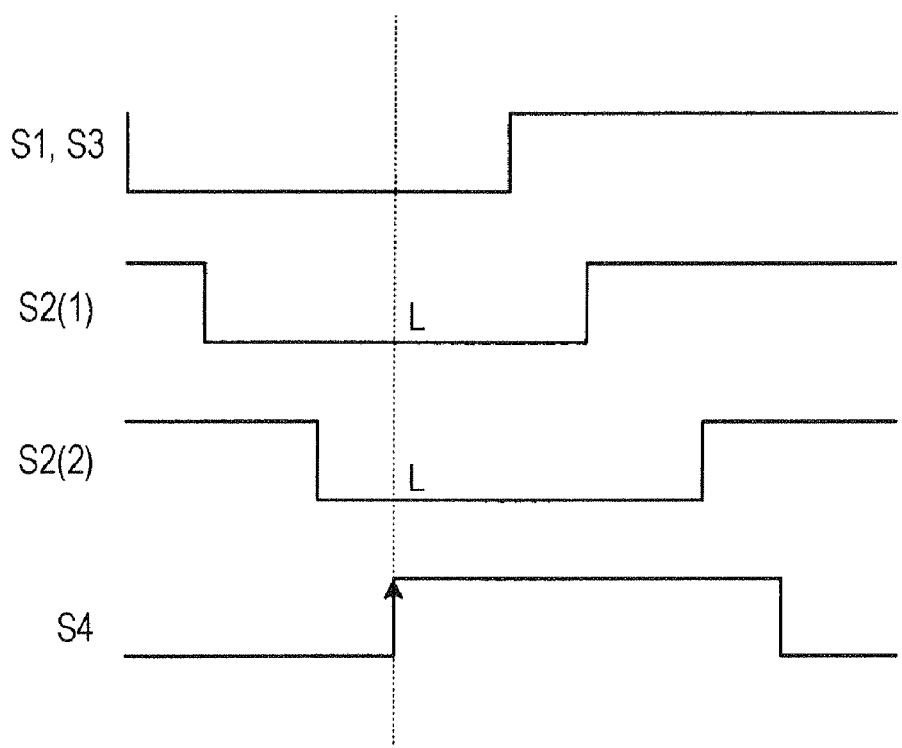
FIG. 4 illustrates an operation of the semiconductor integrated circuit according to the first embodiment.

FIGS. 2 to 4 are timing diagrams illustrating the operation of the semiconductor integrated circuit according to the first embodiment. FIGS. 2 to 4 illustrate an example in which the states of two second signals S2 (S2(1) and S2(2)) are detected at the timing at which the fourth signal S4 goes from low (L) to high (H). As illustrated in FIG. 2, when the amount of delay is standard, the second signals S2(1) and S2(2) are low (L) and high (H), respectively, at, for example, the rising edge of the fourth signal S4. As illustrated in FIG. 3, when the amount of delay is larger than the standard amount, the fourth signal S4 rises at an earlier timing. For example, both of the second signals S2(1) and S2(2) are high (H) at the rising edge of the fourth signal S4. As illustrated in FIG. 4, when the amount of delay is smaller than the standard amount, the timing of the rising of the fourth signal S4 is delayed. Thus, both of the second signals S2(1) and S2(2) are low (L), for example, at the rising edge of the fourth signal S4.

The states of the second signals S2 vary depending on the amount of delay. Thus, by detecting the states of the second signals S2, the detector 3 may detect the amount of delay. The detection of the amount of delay makes it possible to detect changes in the operating conditions. Thus, according to the first embodiment, it may be possible to detect variations in the process conditions and changes in a voltage and a temperature in the circuitry. It is also possible to simplify the configuration of a circuit for detecting variations in the process conditions and changes in the voltage and temperature in the circuitry. The semiconductor integrated circuit may be configured so that the second signal generator 2 has a smaller amount of change in delay relative to a change in the operating conditions than the first signal generator 1.

Figure 5:
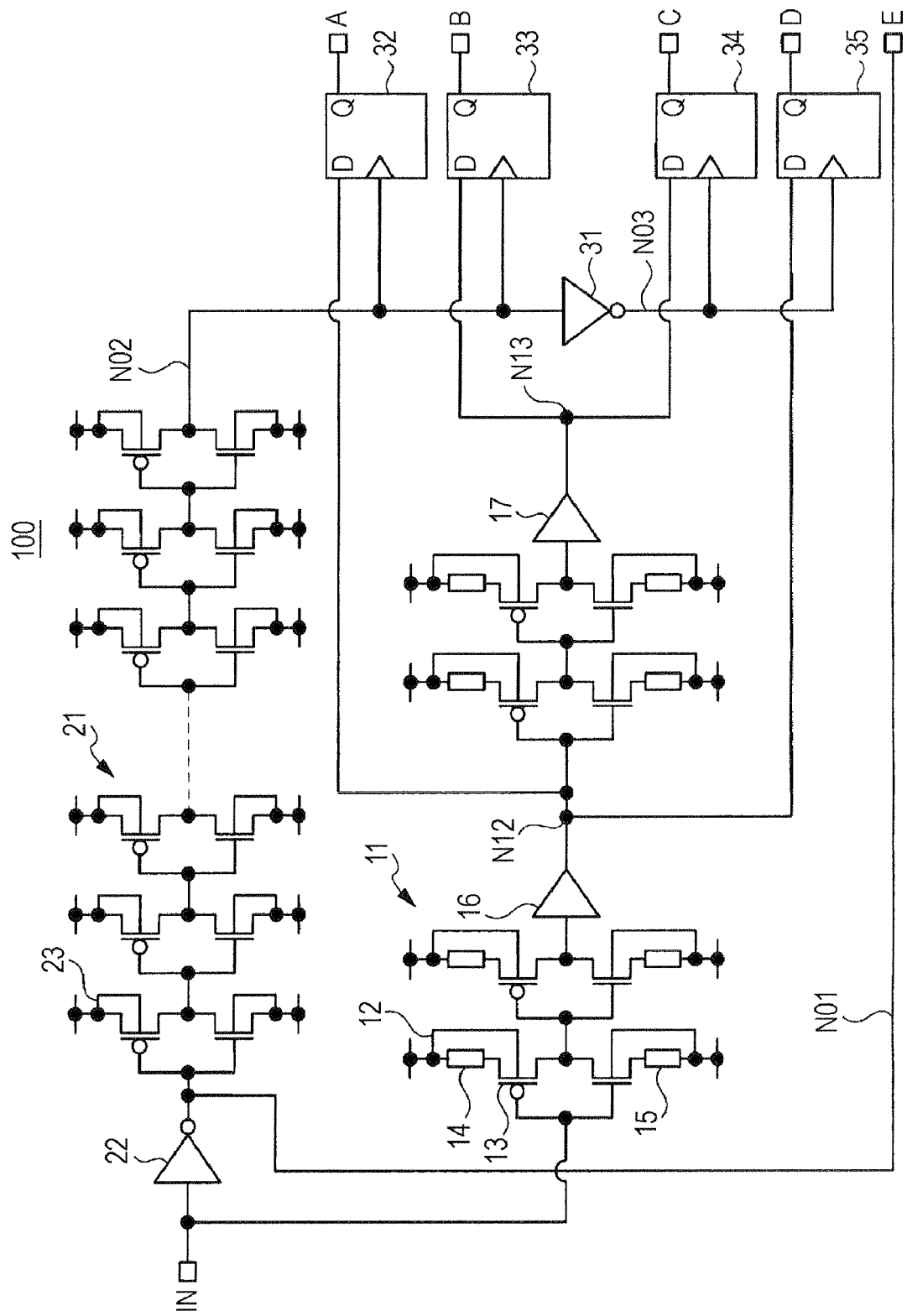
FIG. 5 illustrates a first example of a delay-difference detecting circuit in a second embodiment.

A semiconductor integrated circuit according to a second embodiment has a delay-difference detecting circuit for detecting the amount of delay. FIG. 5 is a circuit diagram of a first example of a delay-difference detecting circuit in the second embodiment. As illustrated in FIG. 5, a delay-difference detecting circuit 100 has a first inverter array 11. For convenience of description, an intermediate node in the first inverter array 11 is indicated as N12 and a node at the end point of the first inverter array 11 is indicated as N13. A plurality of inverters 12 (two in the illustrated example) are coupled in series between a start point of the first inverter array 11 and the node N12 and between the node N12 and the node N13. The inverters 12 operate as delay elements. Buffers 16 and 17 are provided immediately before the node N12 and the node N13, respectively. The start point of the first inverter array 11 is coupled to an input terminal IN of the delay-difference detecting circuit 100.

Each inverter 12 in the first inverter array 11 has a configuration in which a first resistance element 14 and a second resistance element 15 are coupled to, for example, a power-supply potential side and a ground potential side, respectively, of a CMOS (complementary metal oxide semiconductor) inverter 13, which operates as a switching element. A resistance value of the first resistance element 14 and a resistance value of the second resistance element 15 are large enough that variations in the on-resistances of the transistors in the CMOS inverter 13 may be ignored. Variations in the resistance values of the first resistance element 14 and the second resistance element 15 are small compared to variations in the on-resistances of the transistors in the CMOS inverter 13. The first resistance element 14 and the second resistance element 15 are made of, for example, polysilicon, but are not particularly limited thereto. When a signal input to the CMOS inverter 13 is low (L), the first resistance element 14 is coupled to a signal path to thereby cause an output signal of the CMOS inverter 13 to go high (H). When a signal input to the CMOS inverter 13 is high (H), the second resistance element 15 is coupled to the signal path to thereby cause an output signal of the CMOS inverter 13 to go low (L).

The delay-difference detecting circuit 100 has a second inverter array 21. For convenience of description, a node coupled to a start point of the second inverter array 21 is indicated as N01 and a node at an end point of the second inverter array 21 is indicated as N02. The node N01 is coupled between a first inverter 22 and the start point of the second inverter array 21. A plurality of CMOS inverters 23 are coupled in series between the node N01 and the node N02. The CMOS inverters 23 operate as delay elements. The start point of the second inverter array 21 is coupled to the input terminal IN of the delay-difference detecting circuit 100. The resistance values of the first resistance elements 14 and the resistance values of the second resistance elements 15 in the first inverter array 11 are large enough that variations in the on-resistances of the transistors in the CMOS inverters 23 in the second inverter array 21 may be ignored. Thus, the first inverter array 11 has a small amount of change in delay relative to a change in the operating conditions than the second inverter array 21. Examples of the operating conditions include a voltage and a temperature in a circuitry. Thus, variations in the process conditions are also included in the changes in the operating conditions.

The delay-difference detecting circuit 100 includes a second inverter 31 and, for example, a first sequential circuit 32, a second sequential circuit 33, a third sequential circuit 34, and a fourth sequential circuit 35. The second inverter 31 inverts an output signal of the second inverter array 21, that is, a signal of the node N02. For convenience of description, an output node of the second inverter 31 is indicated as N03. The first to fourth sequential circuits 32, 33, 34, and 35 have, for example, D flip-flops. Clock terminals of the first flip-flop circuit (the first sequential circuit) 32 and the second flip-flop circuit (the second sequential circuit) 33 are coupled to the node N02. D terminals of the first flip-flop circuit 32 and the fourth flip-flop circuit (the fourth sequential circuit) 35 are coupled to the node N12. Clock terminals of the third flip-flop circuit (the third sequential circuit) 34 and the fourth flip-flop circuit 35 are coupled to the node N03. D terminals of the second flip-flop circuit 33 and the third flip-flop circuit 34 are coupled to the node N13. A Q terminal of the first flip-flop circuit 32, a Q terminal of the second flip-flop circuit 33, a Q terminal of the third flip-flop circuit 34, and a Q terminal of the fourth flip-flop circuit 35 are coupled to a terminal A, a terminal B, a terminal C, and a terminal D, respectively. The node N01 is coupled to a terminal E.

Figure 6:
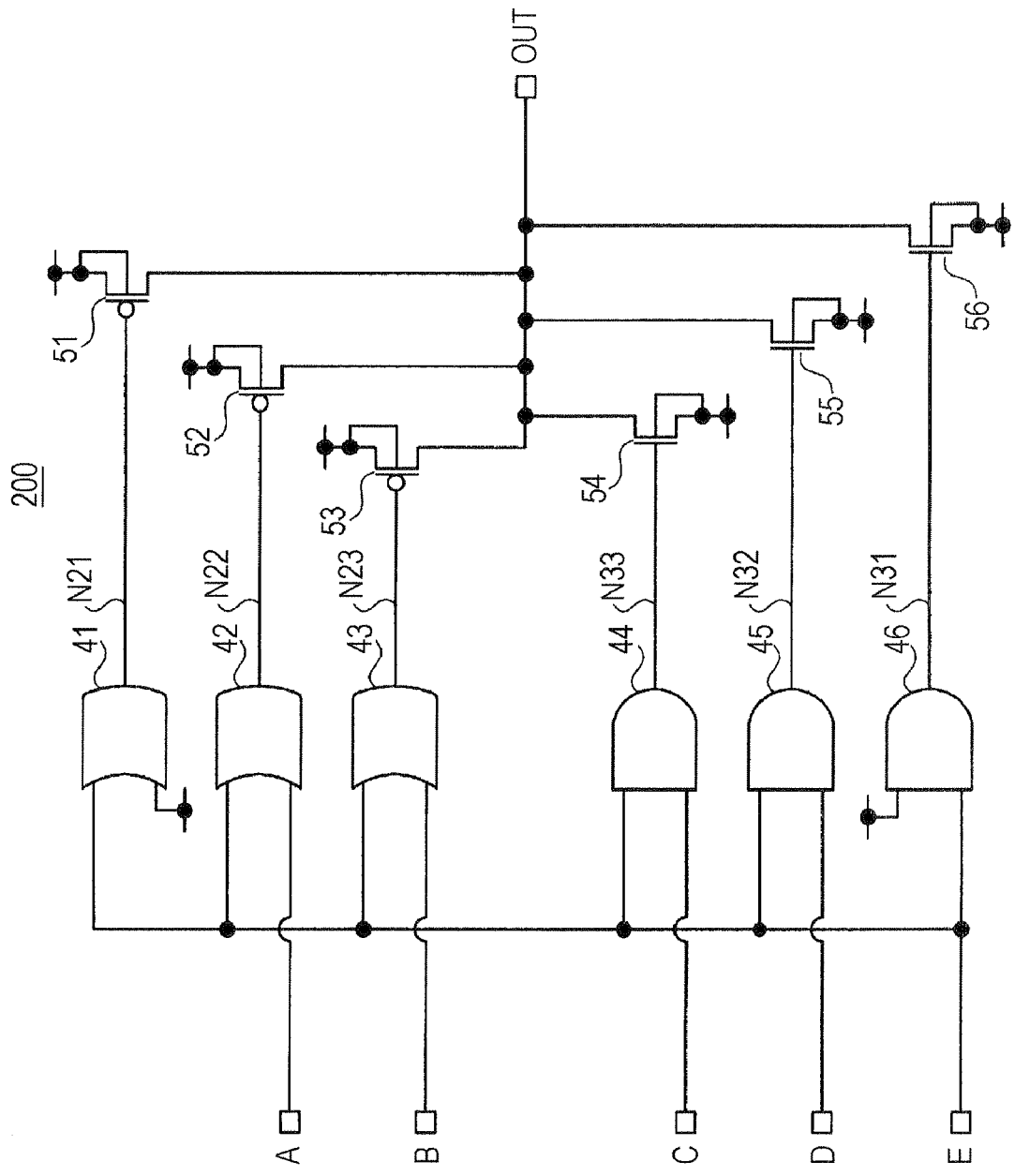
FIG. 6 illustrates a first example of a controlled circuit in the second embodiment.

The semiconductor integrated circuit according to the second embodiment has a controlled circuit that is controlled by the delay-difference detecting circuit 100 described above. FIG. 6 is a circuit diagram of a first example of the controlled circuit in the second embodiment. As illustrated in FIG. 6, a controlled circuit 200 includes, for example, first to third OR circuits 41, 42, and 43, first to third AND circuits 44, 45, and 46, first to third PMOS (Positive-channel Metal Oxide Semiconductor) transistors 51, 52, and 53, and first to third NMOS (Negative-channel Metal Oxide Semiconductor) transistors 54, 55, and 56.

First input terminals of the first OR circuit 41, the second OR circuit 42, the third OR circuit 43, the first AND circuit 44, the second AND circuit 45, and the third AND circuit 46 are coupled to the terminal E of the delay-difference detecting circuit 100. A second input terminal of the first OR circuit 41 is coupled to ground. Second input terminals of the second OR circuit 42, the third OR circuit 43, the first AND circuit 44, and the second AND circuit 45 are coupled to the terminal A, the terminal B, the terminal C, and the terminal D, respectively, of the delay-difference detecting circuit 100. A second input terminal of the third AND circuit 46 is coupled to a power source.

Output terminals of the first OR circuit 41, the second OR circuit 42, and the third OR circuit 43 are coupled to corresponding gate terminals of the first PMOS transistor 51, the second PMOS transistor 52, and the third PMOS transistor 53. Drain terminals of the first PMOS transistor 51, the second PMOS transistor 52, and the third PMOS transistor 53 are coupled to an output terminal OUT of the controlled circuit 200. Output terminals of the first AND circuit 44, the second AND circuit 45, and the third AND circuit 46 are coupled to corresponding gate terminals of the first NMOS transistor 54, the second NMOS transistor 55, and the third NMOS transistor 56. Drain terminals of the first NMOS transistor 54, the second NMOS transistor 55, and the third NMOS transistor 56 are coupled to the output terminal OUT of the controlled circuit 200. The controlled circuit 200 in the first example operates as a circuit for controlling a slew rate. For convenience of description, the output nodes of the first OR circuit 41, the second OR circuit 42, the third OR circuit 43, the first AND circuit 44, the second AND circuit 45, and the third AND circuit 46 are indicated as N21, N22, N23, N33, N32, and N31, respectively.

Figure 7:
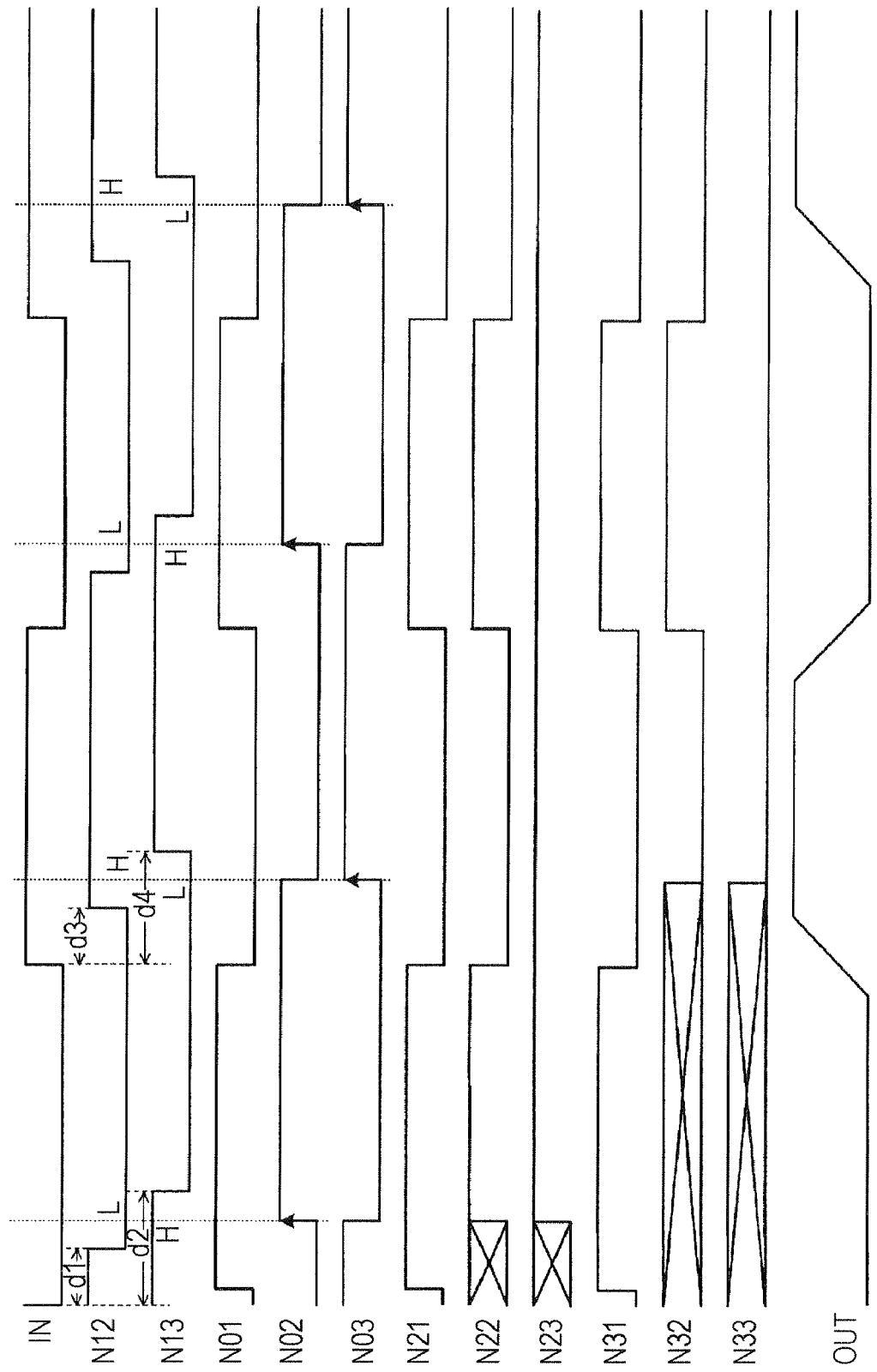
FIG. 7 illustrates an operation of a semiconductor integrated circuit according to the second embodiment.

FIG. 7 is a timing diagram illustrating the operation of the semiconductor integrated circuit according to the second embodiment when the amount of delay is standard. As illustrated in FIG. 7, when a signal input to the input terminal IN goes from high (H) to low (L), the signal at the node N12 goes from high (H) to low (L) with a delay corresponding to an amount of time d1, and the signal at the node N13 goes from high (H) to low (L) with a delay corresponding to an amount of time d2 (where d1<d2). The signal at the node N01 goes from low (L) to high (H) with a delay corresponding to the amount of delay given by the first inverter 22. The signal at the node N02 goes from low (L) to high (H) with a delay from the change of the signal at the node N01. When the amount of delay is standard, the timing at which the signal at the node N02 goes from low (L) to high (H) lies between the timing at which the signal at the node N12 goes from high (H) to low (L) and the timing at which the signal at the node N13 goes from high (H) to low (L). In order to satisfy the relationship of such timings, the number of inverters 12 between the start point of the first inverter array 11 and the node N12 in the delay-difference detecting circuit 100 and the number of inverters 12 between the node N12 and the node N13 are adjusted. The number of CMOS inverters 23 in the second inverter array 21 is also adjusted.

When the signal input to the input terminal IN goes from low (L) to high (H), the signals of the node N12 and the node N13 go from low (L) to high (H) with delays corresponding to amounts of times d3 and d4 (where d3<d4), respectively. Typically, d3 and d4 are substantially equal to d1 and d2, respectively. The signal at the node N01 goes from high (H) to low (L) with a delay corresponding to the amount of delay given by the first inverter 22. The signal at the node N03 goes from low (L) to high (H) with a delay from the change of the signal at the node N01. When the amount of delay is standard, the timing at which the signal at the node N03 goes from low (L) to high (H) lies between the timing at which the signal at the node N12 goes from low (L) to high (H) and the timing at which the signal at the node N13 goes from low (L) to high (H). In order to satisfy the relationship of such timings, the number of inverters 12 between the start point of the first inverter array 11 and the node N12 in the delay-difference detecting circuit 100 and the number of inverters 12 between the node N12 and the node N13 are adjusted. The number of CMOS inverters 23 in the second inverter array 21 is also adjusted.

When the signal at the node N02 goes from low (L) to high (H), the delay-difference detector circuit 100 operates in the following manner. The signal level of the node N21 becomes substantially equal to the signal level of the terminal E (the node N01). Further, since the first flip-flop circuit 32 outputs a low (L) signal of the node N12, the signal at the terminal A is low (L) until the signal at the node N02 next goes from low (L) to high (H) and the signal level of the node N22 is substantially equal to the signal level of the terminal E (the node N01). Since the second flip-flop circuit 33 outputs a high (H) signal of the node N13, the signal at the terminal B is high (H) and the signal at the node N23 is high (H) until the signal at the node N02 next goes from low (L) to high (H). These operations are repeated so that each of the first PMOS transistor 51 and the second PMOS transistor 52 is put into the ON state when the signal input to the input terminal IN is high (H) and is put into the OFF state when the signal input to the input terminal IN is low (L). The third PMOS transistor 53 does not operate.

When the signal at the node N03 goes from low (L) to high (H), the delay-difference detector circuit 100 operates in the following manner. The signal level of the node N31 becomes substantially equal to the signal level of the terminal E (the node N01). Further, since the fourth flip-flop circuit 35 outputs a high (H) signal of the node N12, the signal at the terminal D is high (H) until the signal at the node N03 next goes from low (L) to high (H) and the signal level of the node N32 is substantially equal to the signal level of the terminal E (the node N01). Since the third flip-flop circuit 34 outputs a low (L) signal of the node N13, the signal at the terminal C is low (L) and the node N33 is low (L) until the signal at the node N03 next goes from low (L) to high (H). These operations are repeated, so that each of the third NMOS transistor 56 and the second NMOS transistor 55 is put into the ON state when the signal input to the input terminal IN is low (L) and is put into the OFF state when the signal input to the input terminal IN is high (H). The first NMOS transistor 54 does not operate.

Thus, in response to a signal input to the delay-difference detecting circuit 100, the controlled circuit 200 drives PMOS transistors 51 and 52 and NMOS transistors 55 and 56, so that a signal having substantially the same level as that at the input terminal IN is output from the output terminal OUT. As described above, the PMOS transistors 51 and 52 are controlled with a delay of a half cycle after the signal input to the input terminal IN falls in order to control the number of PMOS transistors driven. Similarly, the NMOS transistors 55 and 56 are controlled with a delay of a half cycle after the input signal rises in order to control the number of NMOS transistors driven. That is, the number of PMOS transistors driven is controlled at the falling edge of the signal input to the input terminal IN and the number of NMOS transistors driven is controlled at the rising edge of the signal input to the input terminal IN. The timing at which the transistors for the output are controlled are delayed by a half cycle relative to the input signal in the manner described above, thereby eliminating an influence caused by a delay of the signal input to the delay-difference detecting circuit 100.

Figure 8:
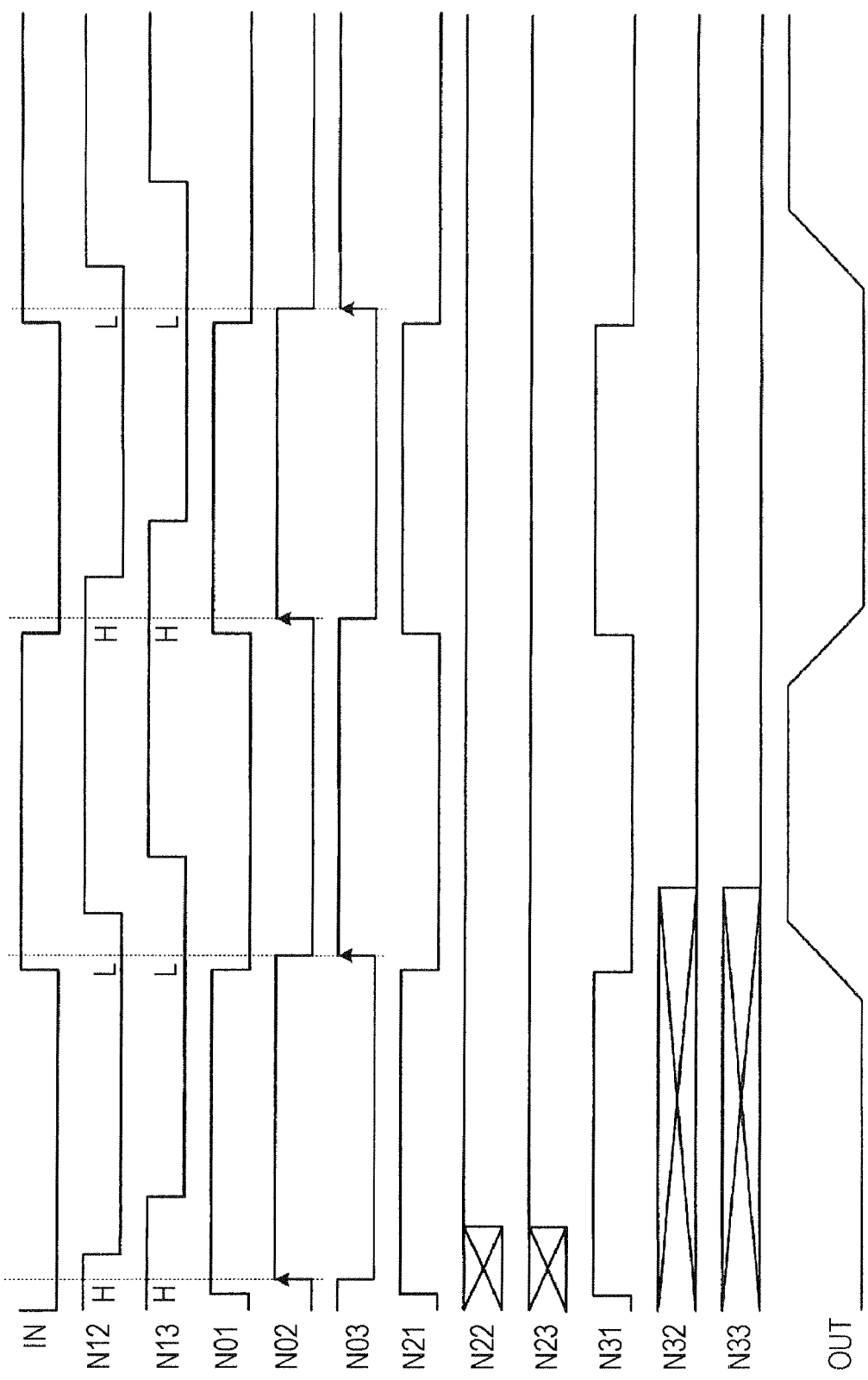
FIG. 8 illustrates an operation of the semiconductor integrated circuit according to the second embodiment.

FIG. 8 is a timing diagram illustrating the operation of the semiconductor integrated circuit according to the second embodiment when the amount of delay is larger than the standard amount of delay. As illustrated in FIG. 8, when the amount of delay is larger than the standard amount, the timing at which the signal at the node N02 goes from low (L) to high (H) is advanced compared to the case of the standard amount of delay. The timings at which the signals of the nodes N12 and N13 go from high (H) to low (L) do not substantially change. The signal at the node N02 goes from low (L) to high (H) when both of the signals of the nodes N12 and node N13 are high (H). The signal at the node N03 goes from low (L) to high (H) when both of the signals of the nodes N12 and node N13 are low (L). In order to satisfy the relationship of such timings, the number of inverters 12 between the start point of the first inverter array 11 and the node N12 in the delay-difference detecting circuit 100 and the number of inverters 12 between the node N12 and the node N13 are adjusted. The number of CMOS inverters 23 in the second inverter array 21 is also adjusted.

When the signal at the node N02 goes from low (L) to high (H), the delay-difference detector circuit 100 operates in the following manner. The signal level of the node N21 becomes substantially equal to the signal level of the terminal E (the node N01). Since the first flip-flop circuit 32 outputs a high (H) signal of the node N12, the signal at the terminal A is high (H) and the signal at the node N22 is high (H) until the signal at the node N02 next goes from low (L) to high (H). Since the second flip-flop circuit 33 outputs a high (H) signal of the node N13, the signal at the terminal B is high (H) and the signal at the node N23 is high (H) until the signal at the node N02 next goes from low (L) to high (H). Since these operations are repeated, the first PMOS transistor 51 is put into the ON state when the signal input to the input terminal IN is high (H) and is put into the OFF state when the signal input to the input terminal IN is low (L). The second PMOS transistor 52 and the third PMOS transistor 53 do not operate.

When the signal at the node N03 goes from low (L) to high (H), the delay-difference detector circuit 100 operates in the following manner. The signal level of the node N31 becomes substantially equal to the signal level of the terminal E (the node N01). Since the fourth flip-flop circuit 35 outputs a low (L) signal of the node N12, the signal at the terminal D is low (L) and the signal at the node N32 is low (L) until the signal at the node N03 next goes from low (L) to high (H). Since the third flip-flop circuit 34 outputs a low (L) signal of the node N13, the signal at the terminal C is low (L) and the signal at the node N33 is low (L) until the signal at the node N03 next goes from low (L) to high (H). Since these operations are repeated, the third NMOS transistor 56 is put into the ON state when the signal input to the input terminal IN is low (L) and is put into the OFF state when the signal input to the input terminal IN is high (H). The first NMOS transistor 54 and the second NMOS transistor 55 do not operate. That is, in response to a signal input to the delay-difference detecting circuit 100, the controlled circuit 200 drives one PMOS transistor 51 one NMOS transistor 56, so that a signal having substantially the same level as that at the input terminal IN is output from the output terminal OUT.

Figure 9:
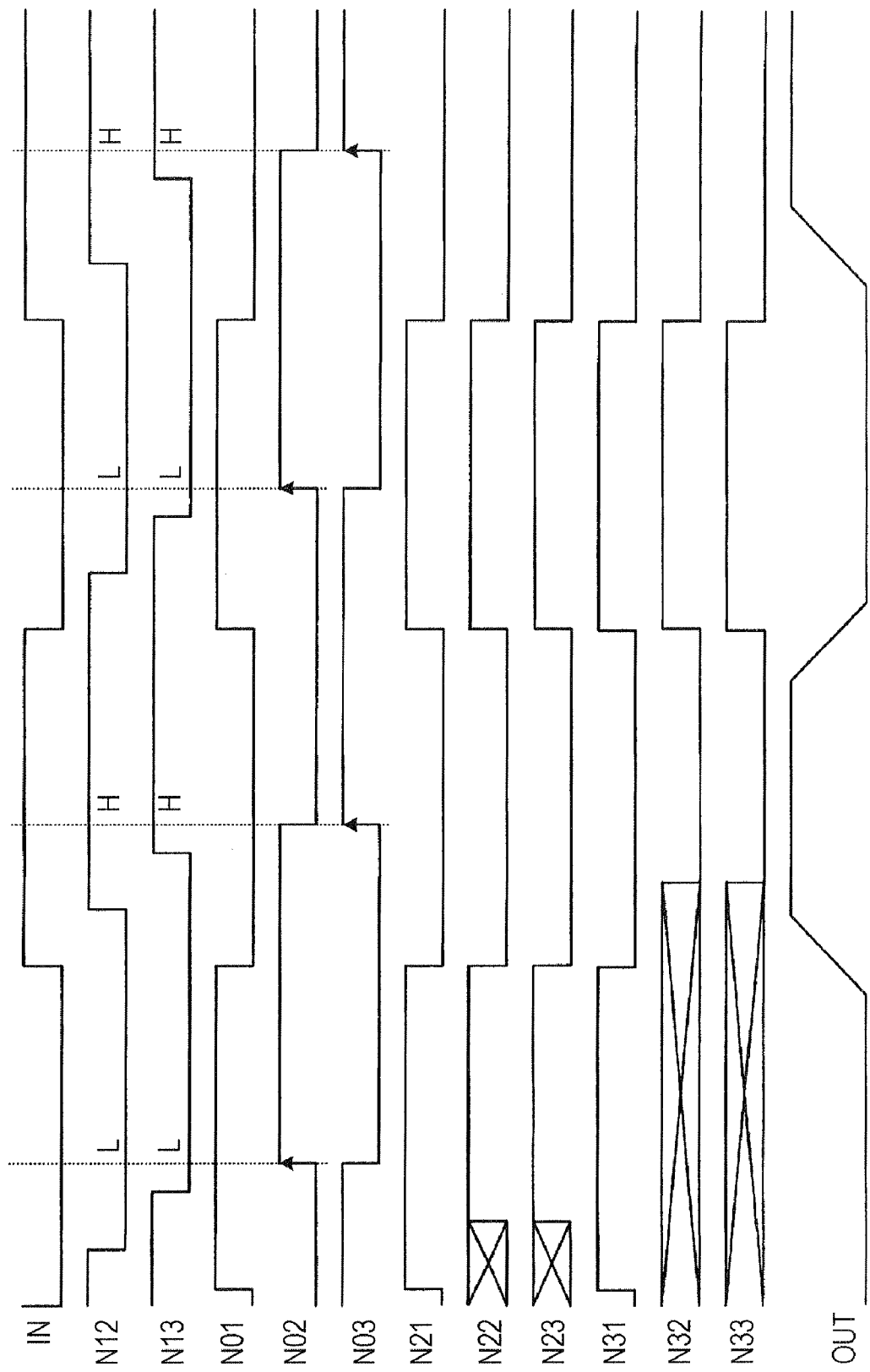
FIG. 9 illustrates an operation of the semiconductor integrated circuit according to the second embodiment.

FIG. 9 is a timing diagram illustrating the operation of the semiconductor integrated circuit according to the second embodiment when the amount of delay is smaller than the standard amount of delay. As illustrated in FIG. 9, when the amount of delay is smaller than the standard amount, the timing at which the signal at the node N02 goes from low (L) to high (H) is delayed compared to the case of the standard amount of delay. The timing at which the signals of the nodes N12 and N13 go from high (H) to low (L) does not substantially change. The signal at the node N02 goes from low (L) to high (H) when both of the signals of the nodes N12 and node N13 are low (L). The signal at the node N03 goes from low (L) to high (H) when both of the signals of the nodes N12 and node N13 are high (H). In order to satisfy the relationship of the timings, the number of inverters 12 between the start point of the first inverter array 11 and the node N12 in the delay-difference detecting circuit 100 and the number of inverters 12 between the node N12 and the node N13 are adjusted. The number of CMOS inverters 23 in the second inverter array 21 is also adjusted.

When the signal at the node N02 goes from low (L) to high (H), the delay-difference detector circuit 100 operates in the following manner. The signal level of the node N21 becomes substantially equal to the signal level of the terminal E (the node N01). Further, since the first flip-flop circuit 32 outputs a low (L) signal of the node N12, the signal at the terminal A is low (L) until the signal at the node N02 next goes from low (L) to high (H) and the signal level of the node N22 is substantially equal to the signal level of the terminal E (the node N01). Since the second flip-flop circuit 33 outputs a low (L) signal of the node N13, the signal at the terminal B is low (L) until the signal at the node N02 next goes from low (L) to high (H) and the signal level of the node N23 is substantially equal to the signal level of the terminal E (the node N01). These operations are repeated, so that each of the first PMOS transistor 51, the second PMOS transistor 52, and the third PMOS transistor 53 is put into the ON state when the signal input to the input terminal IN is high (H) and is put into the OFF state when the signal input to the input terminal IN is low (L).

When the signal at the node N03 goes from low (L) to high (H), the delay-difference detector circuit 100 operates in the following manner. The signal level of the node N31 becomes substantially equal to the signal level of the terminal E (the node N01). Further, since the fourth flip-flop circuit 35 outputs a high (H) signal of the node N12, the signal at the terminal D is high (H) until the signal at the node N03 next goes from low (L) to high (H) and the signal level of the node N32 is substantially equal to the signal level of the terminal E (the node N01). Since the third flip-flop circuit 34 outputs a high (H) signal of the node N13, the signal at the terminal C is high (H) until the signal at the node N03 next goes from low (L) to high (H) and the signal level of the node N33 is substantially equal to the signal level of the terminal E (the node N01). These operations are repeated, so that each of the first NMOS transistor 54, the second NMOS transistor 55, and the third NMOS transistor 56 is put into the ON state when the signal input to the input terminal IN is low (L) and is put into the OFF state when the signal input to the input terminal IN is high (H). That is, in response to a signal input to the delay-difference detecting circuit 100, the controlled circuit 200 drives three PMOS transistors 51, 52, and 53 and three NMOS transistors 54, 55, and 56, so that a signal having substantially the same level as that at the input terminal IN is output from the output terminal OUT.

Figure 10:
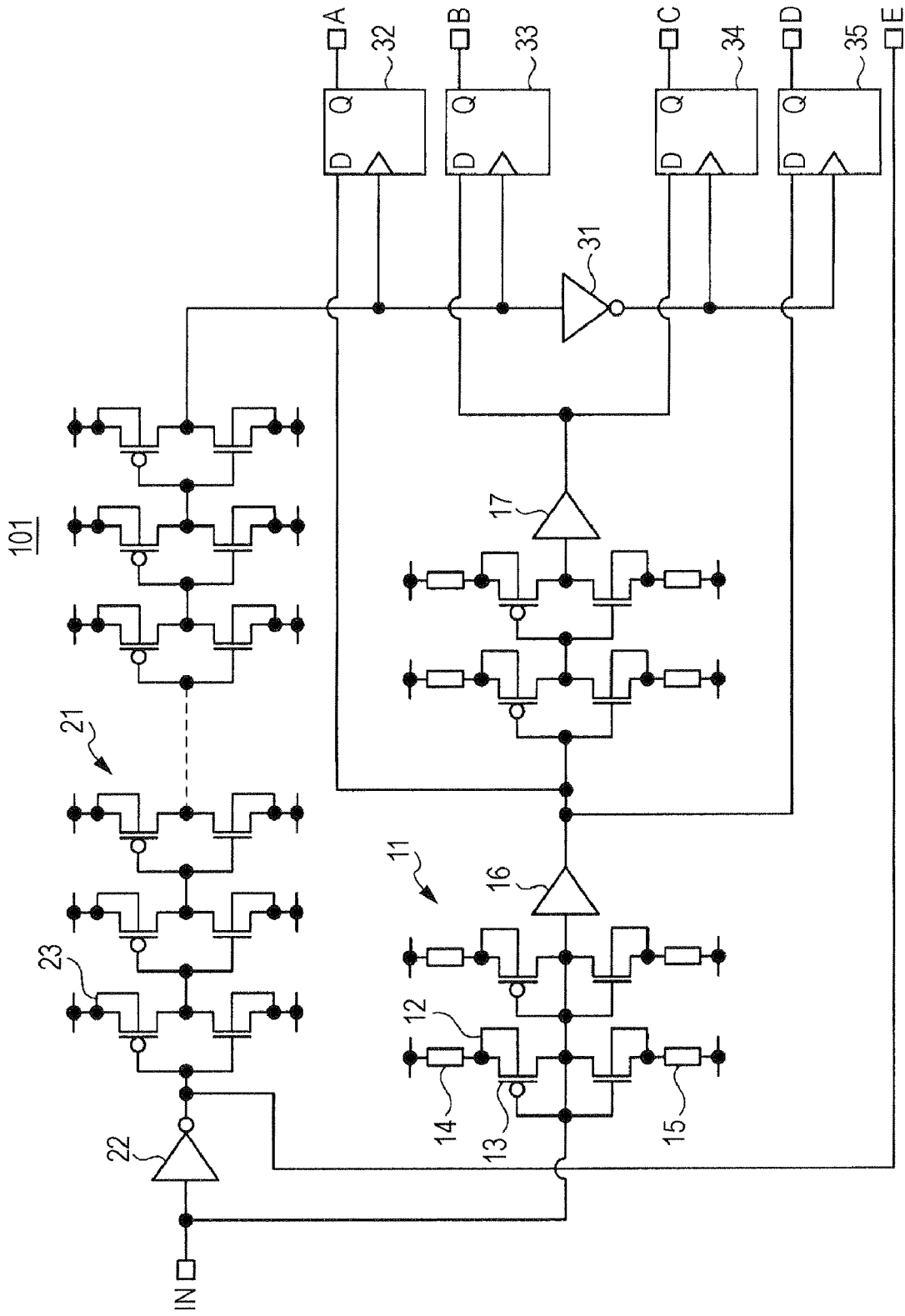
FIG. 10 illustrates a second example of the delay-difference detecting circuit in the second embodiment.

FIG. 10 is a circuit diagram of a second example of the delay-difference detecting circuit according to the second embodiment. In a delay-difference detecting circuit 101 in the second example illustrated in FIG. 10, back gates of transistors in the CMOS inverter 13 in each inverter 12 in the first inverter array 11 may be coupled to the source terminals of the corresponding transistors. In the first example illustrated in FIG. 5, the back gates of the PMOS transistors in the CMOS inverters 13 are coupled to a power source. In the first example, the back gates of the NMOS transistors in the CMOS inverters 13 are coupled to ground. Other configurations and operations are analogous to those in the first example.

Figure 11:
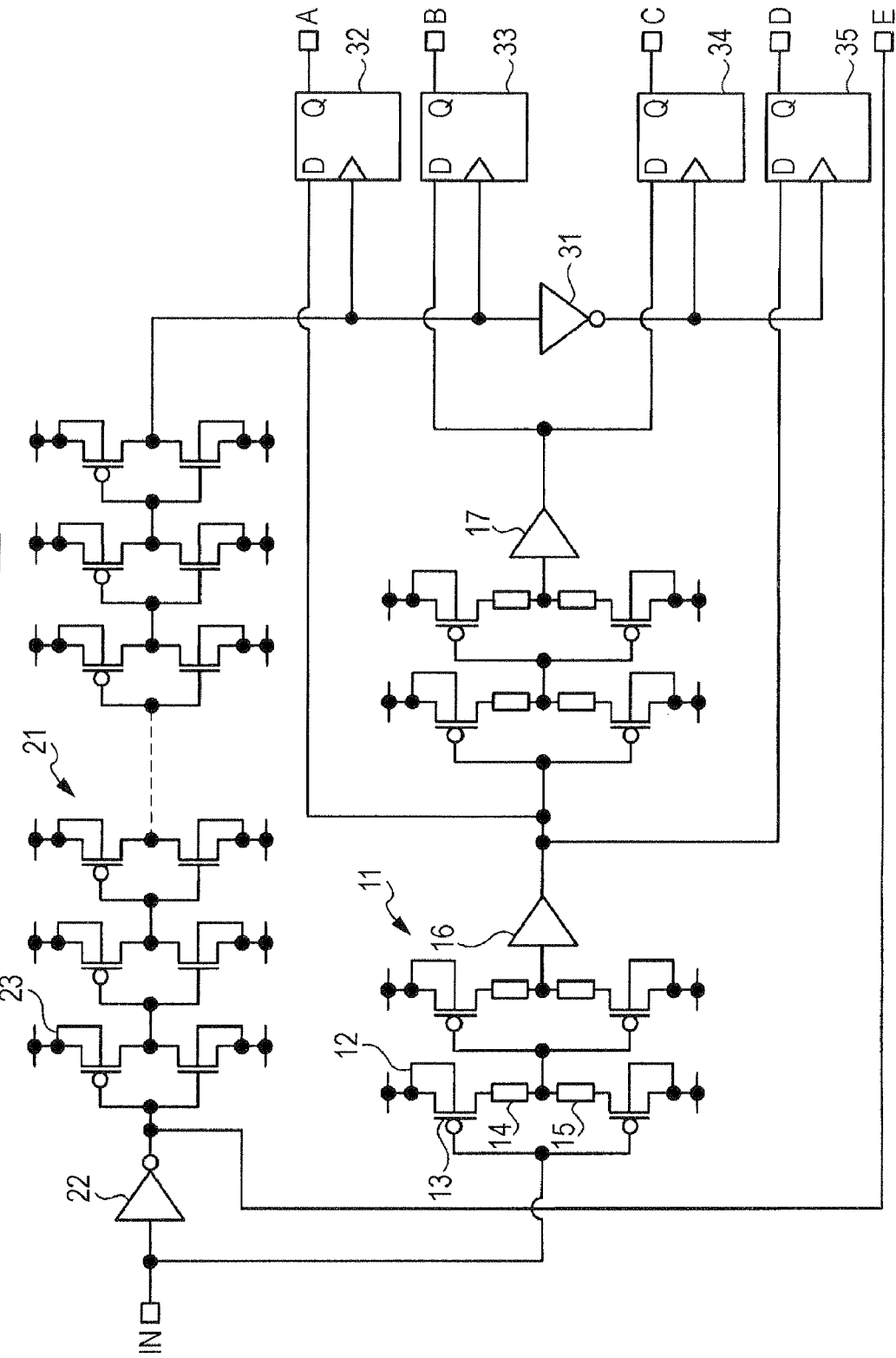
FIG. 11 illustrates a third example of the delay-difference detecting circuit in the second embodiment.

FIG. 11 is a circuit diagram of a third example of the delay-difference detecting circuit according to the second embodiment. In a delay-difference detecting circuit 102 in the third example illustrated in FIG. 11, a first resistance element 14 and a second resistance element 15 may be coupled between the PMOS transistor and the NMOS transistor in the CMOS inverter 13 in each inverter 12 in the first inverter array 11. Other configurations and operations are analogous to those in the first example.

Figure 12:
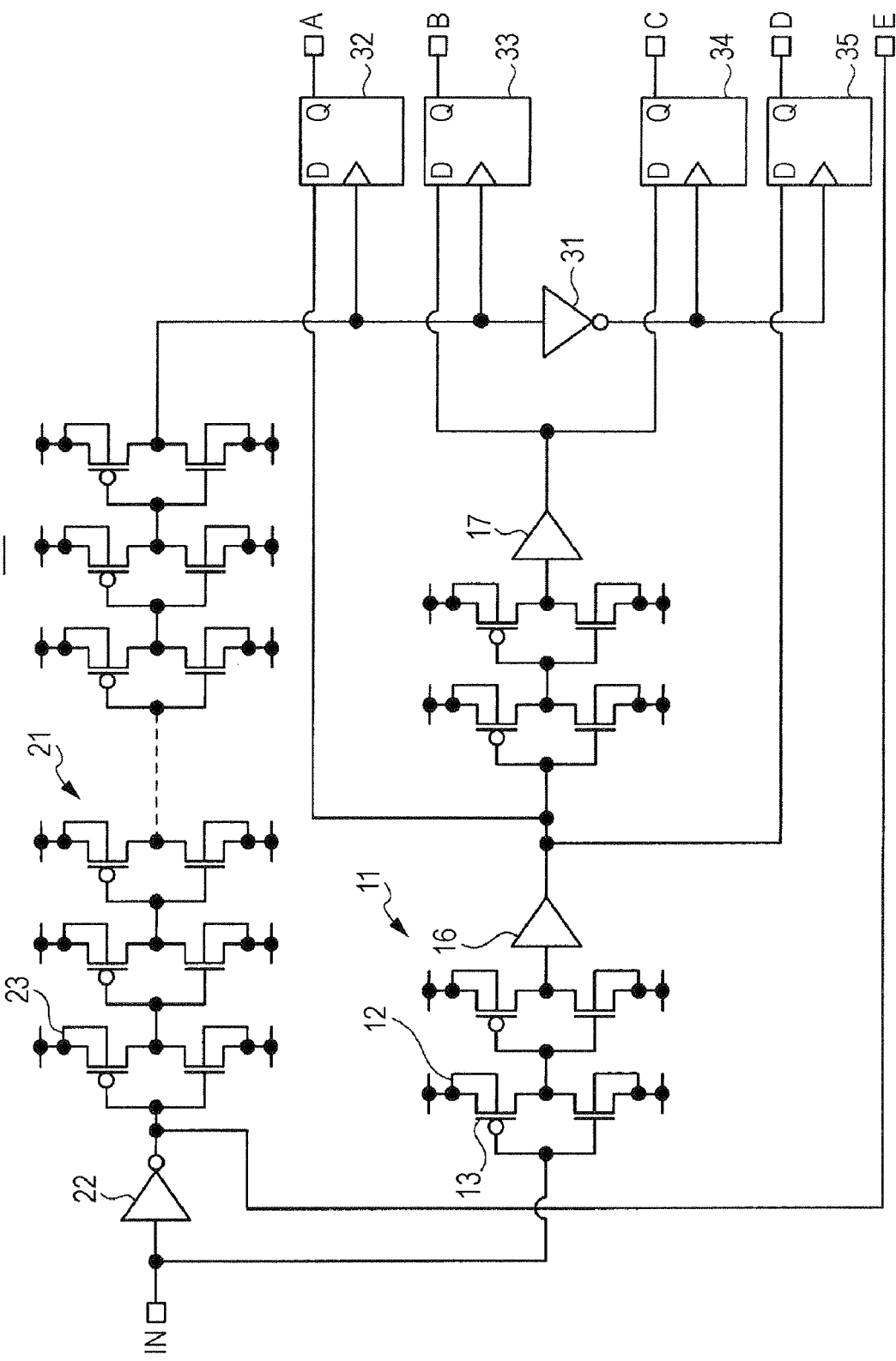
FIG. 12 illustrates a fourth example of the delay-difference detecting circuit in the second embodiment.

FIG. 12 is a circuit diagram of a fourth example of the delay-difference detecting circuit according to the second embodiment. In a delay-difference detecting circuit 103 in the fourth example illustrated in FIG. 12, lines of the transistors in the CMOS inverters 13 in the inverters 12 in the first inverter array 11 and the CMOS inverters 23 in the second inverter array 21 may be made of polysilicon. The width of the lines of the CMOS inverters 13 in the first inverter array 11 may be larger than the width of the lines of the CMOS inverters 23 in the second inverter array 21. With this arrangement, the first inverter array 11 has a smaller amount of change in delay relative to changes in the operating conditions than the second inverter array 21. In this case, a first resistance element and a second resistance element may be or may not be coupled to the inverters 12 in the first inverter array 11. Other configurations and operations are analogous to those in the first example.

Figure 13:
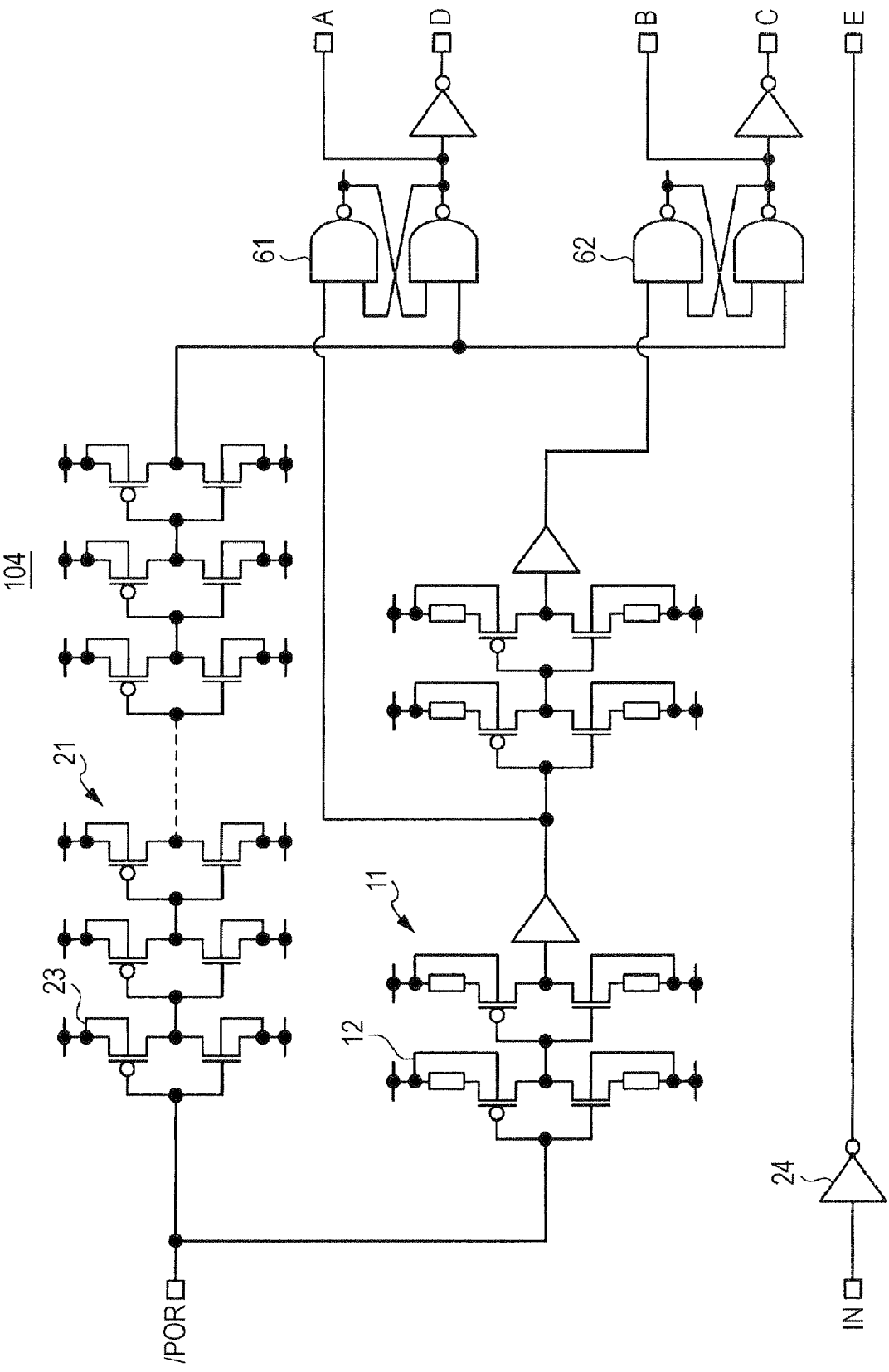
FIG. 13 illustrates a fifth example of the delay-difference detecting circuit in the second embodiment.

FIGS. 13 to 16 are circuit diagrams of fifth to eighth examples, respectively, of the delay-difference detecting circuit according to the second embodiment. As illustrated in FIG. 13, in a fifth delay-difference detecting circuit 104, an RS flip-flop 61 is used as sequential circuits, instead of two D flip-flops of the first sequential circuit 32 and the fourth sequential circuit 35 in the first example illustrated in FIG. 5. An RS flip-flop 62 is also used instead of two D flip-flops of the second sequential circuit 33 and the third sequential circuit 34. The start point of the first inverter array 11 and the end point of the second inverter array 21 are coupled to a power-on-reset terminal /POR. In this case, "/" of "/POR" indicates low-active. Terminals and signals are high-active, unless otherwise particularly stated. In the fifth example, a signal delayed by the first inverter array 11 and a signal delayed by the second inverter array 21 are obtained based on the rising edge of a power-on-reset signal. In the second inverter array 21, an even number of stages of the CMOS inverters 23 are coupled in series. The first inverter located at the front in the second inverter array 21 and the second inverter for inverting an output signal of the second inverter array 21 may not be necessary. A third inverter 24 is coupled between the input terminal IN and the terminal E. When the semiconductor integrated circuit has a configuration in which the signal input to the input terminal IN is sent to the terminal E via the third inverter 24 without being input to the first inverter array 11 and the second inverter array 21, an output node of the third inverter 24 corresponds to the node N01.

Figure 14:
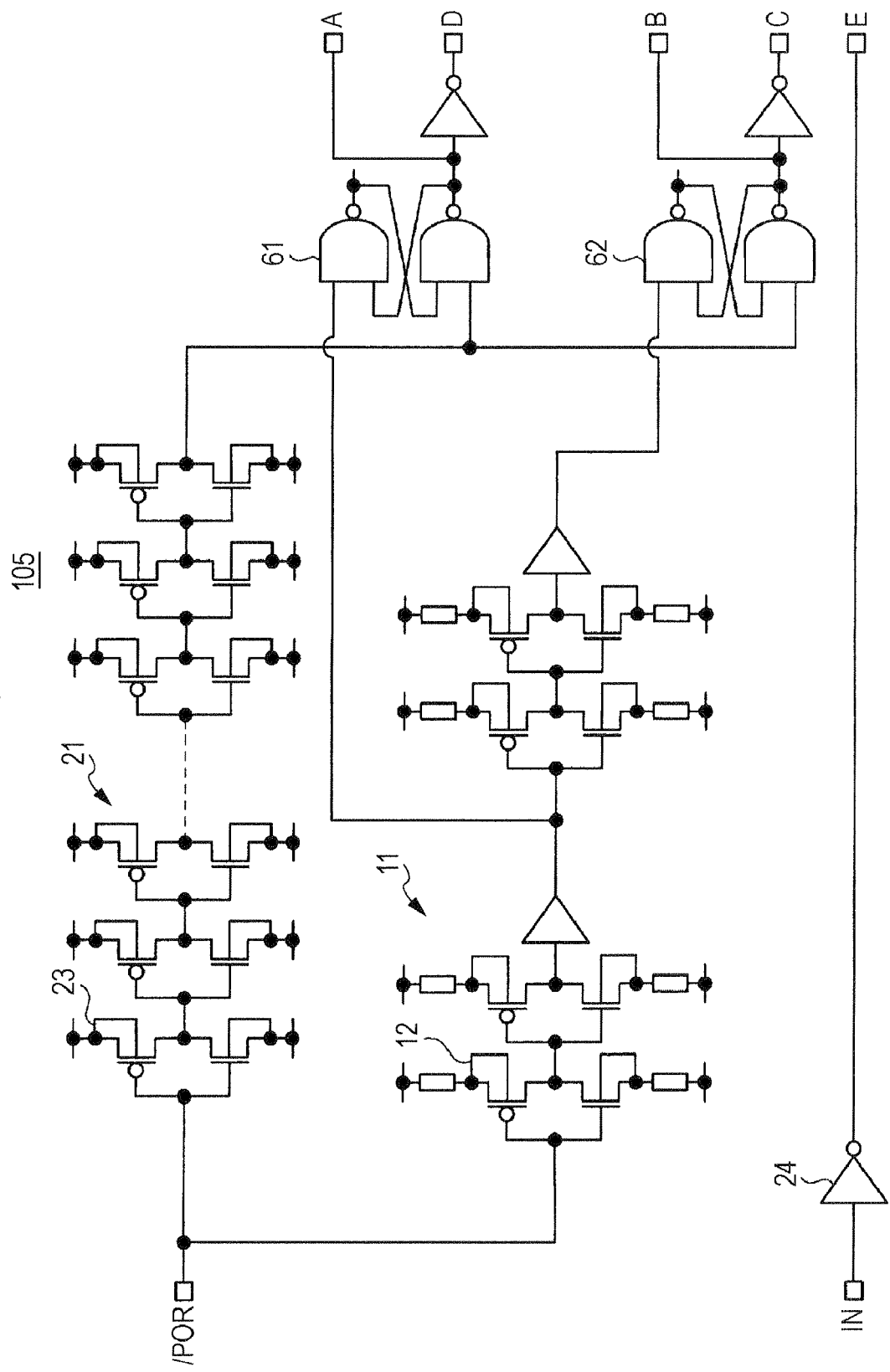
FIG. 14 illustrates a sixth example of the delay-difference detecting circuit in the second embodiment.
Figure 15:
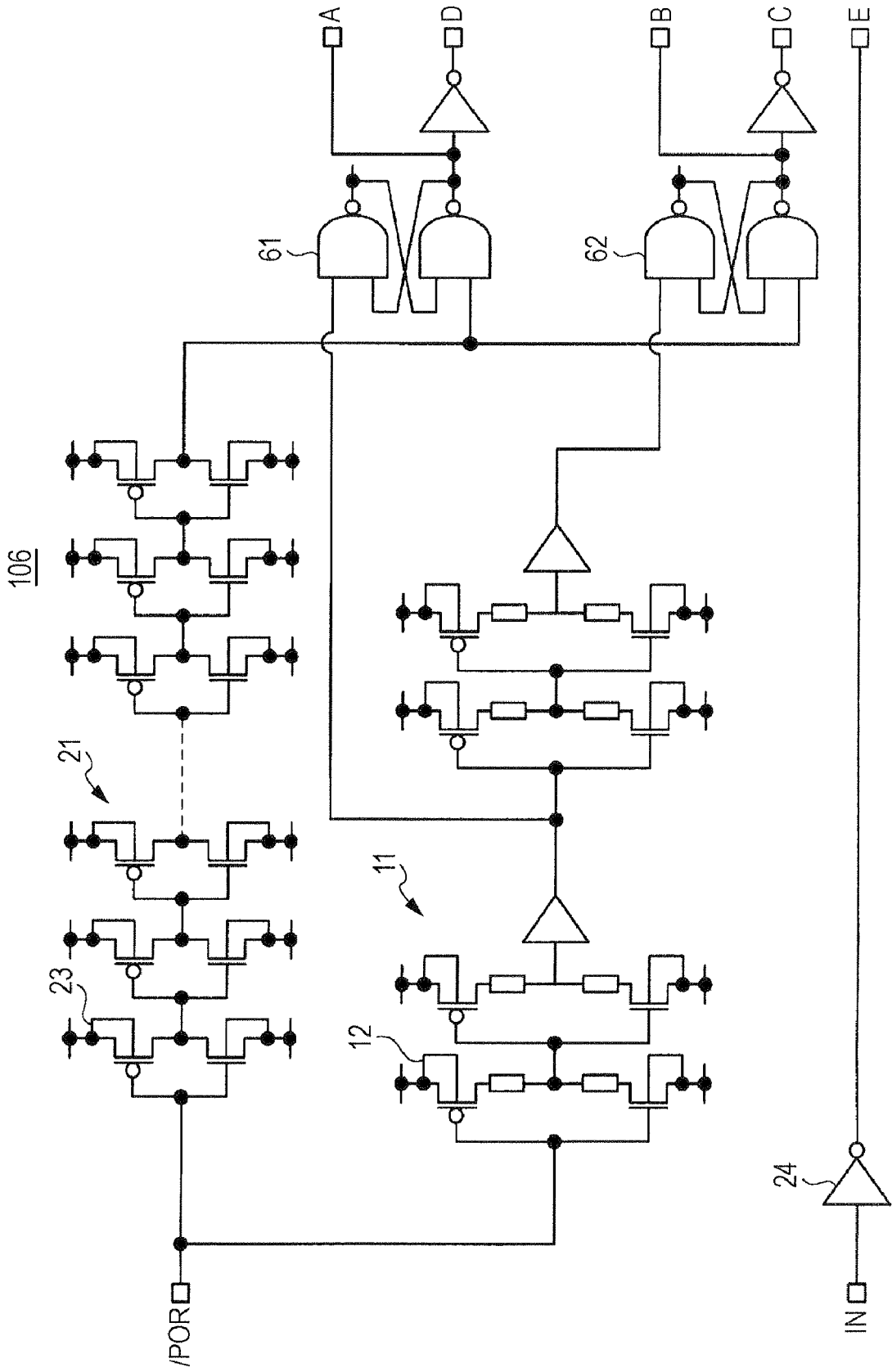
FIG. 15 illustrates a seventh example of the delay-difference detecting circuit in the second embodiment.
Figure 16:
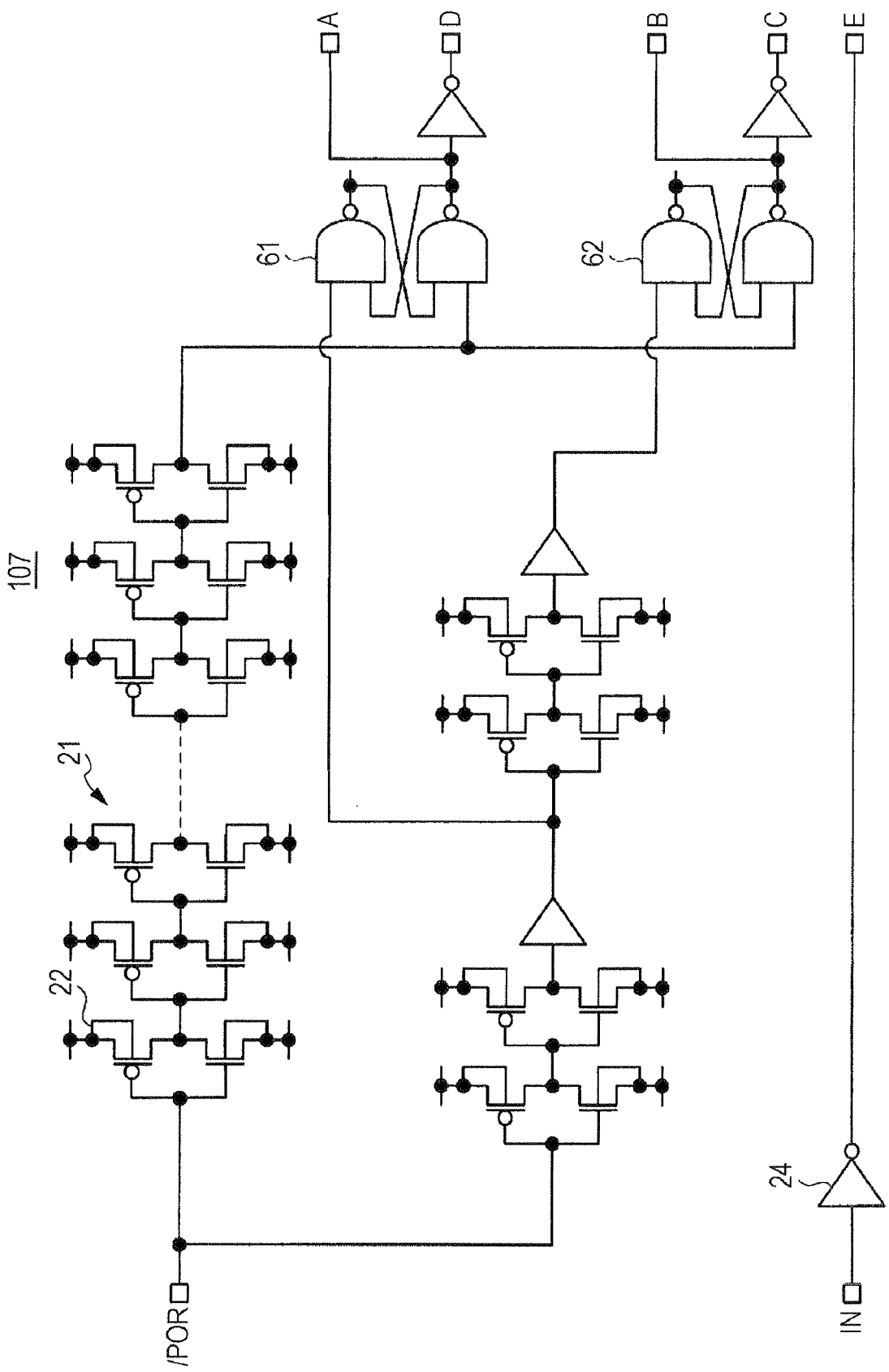
FIG. 16 illustrates an eighth example of the delay-difference detecting circuit in the second embodiment.

A delay-difference detecting circuit 105 illustrated in FIG. 14 has a configuration in which RS flip-flops 61 and 62 are used as sequential circuits in the second example illustrated in FIG. 10, as in the fifth example. In a seventh delay-difference detecting circuit 106 illustrated in FIG. 15 and an eighth delay-difference detecting circuit 107 illustrated in FIG. 16, RS flip-flops 61 and 62 are used in the third example illustrated in FIG. 11 and the fourth example illustrated in FIG. 12, respectively, as in the fifth example. According to the fifth to eighth examples of the delay-difference detecting circuits, since the delay-difference detecting circuit operates immediately after resetting and then stops, it may be possible to reduce power consumed by the delay-difference detecting circuit.

Figure 17:
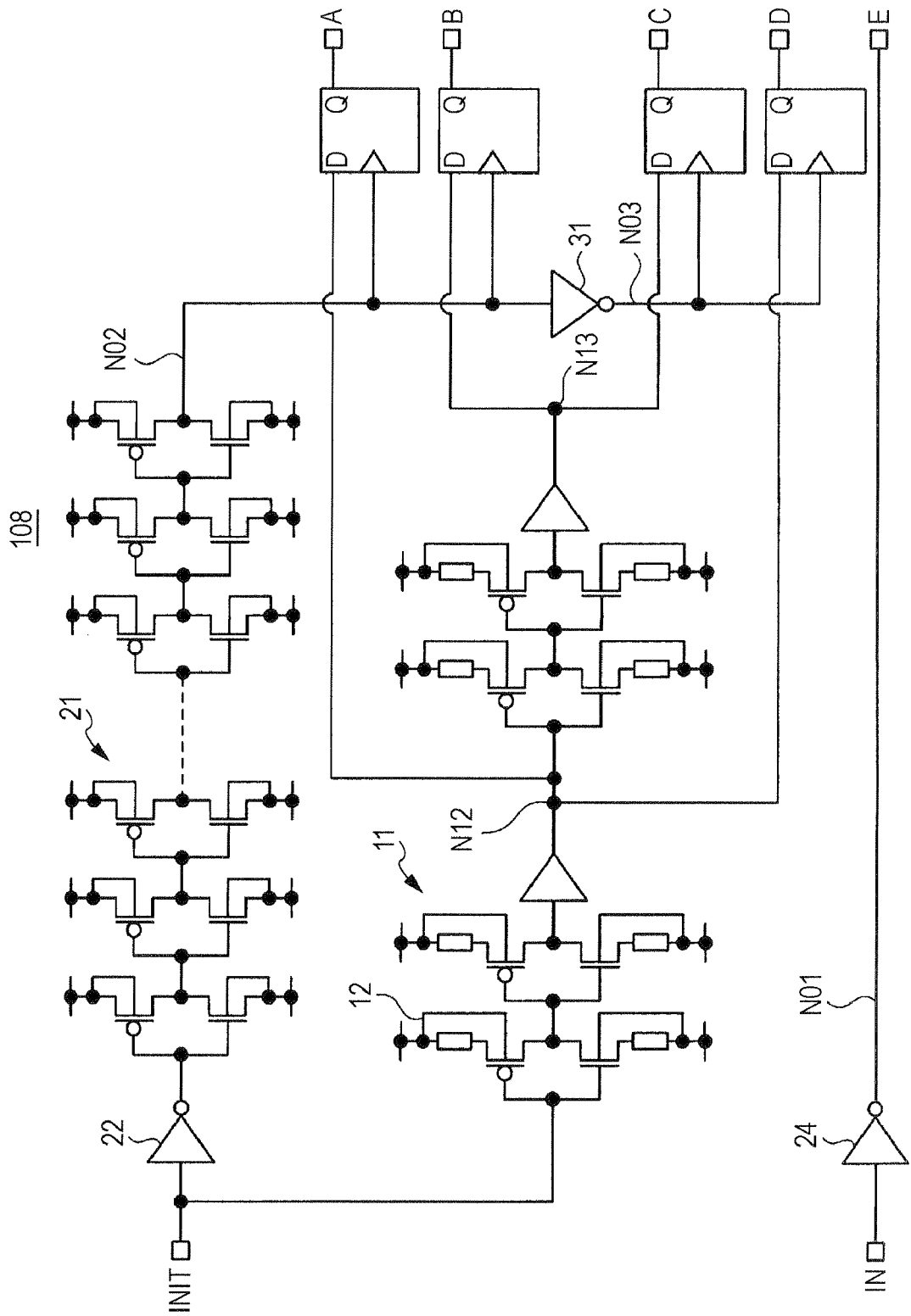
FIG. 17 illustrates a ninth example of the delay-difference detecting circuit in the second embodiment.
Figure 18:
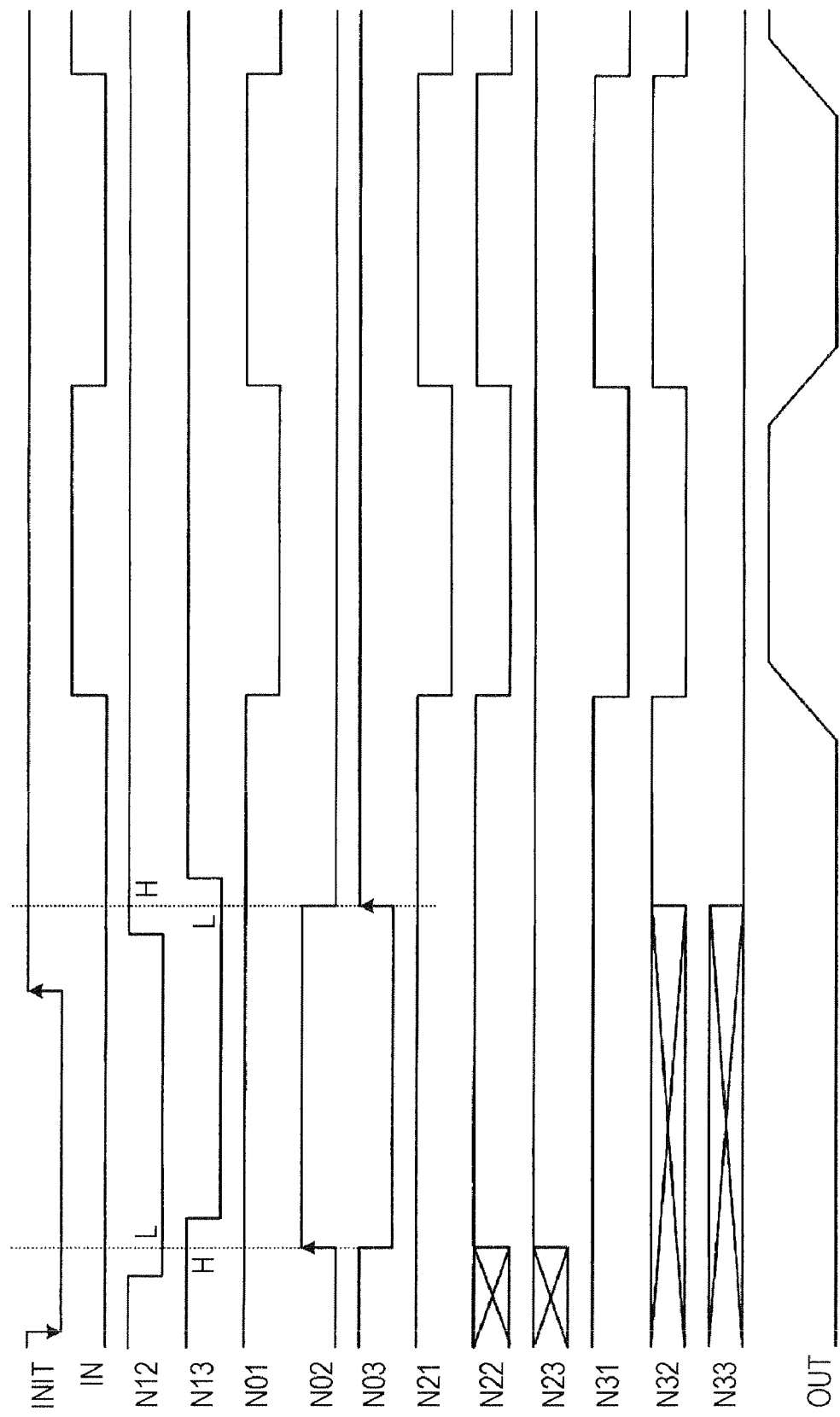
FIG. 18 illustrates an operation of the ninth example of the delay-difference detecting circuit in the second embodiment.

FIG. 17 is a circuit diagram of a ninth example of the delay-difference detecting circuit according to the second embodiment. As illustrated in FIG. 17, in a ninth delay-difference detecting circuit 108, the start point of the first inverter array 11 and the start point of the second inverter array 21 in the first example illustrated in FIG. 5 are coupled to an input terminal INIT for an initial signal. A third inverter 24 is coupled between the input terminal IN and the terminal E. A node N01 is an output node of the third inverter 24. FIG. 18 is a timing diagram illustrating an operation when the ninth example of the delay-difference detecting circuit according to the second embodiment is used when the amount of delay is standard. As illustrated in FIG. 18, the initial signal goes from high (H) to low (L), goes from low (L) to high (H), and is then fixed to high (H). In the ninth example, a signal delayed by the first inverter array 11 and a signal delayed by the second inverter array 21 are obtained based on one falling edge and one rising edge of the initial signal. Since the delay-difference detecting circuit according to the ninth example operates once and then stops the operation, it consumes less power. A signal that goes from high (H) to low (L) and a signal that goes from low (L) to high (H) may be used, as the initial signal, at different timings. The configurations in the second to fourth examples of the delay-difference detecting circuits may be the same as that in the ninth example.

Figure 19:
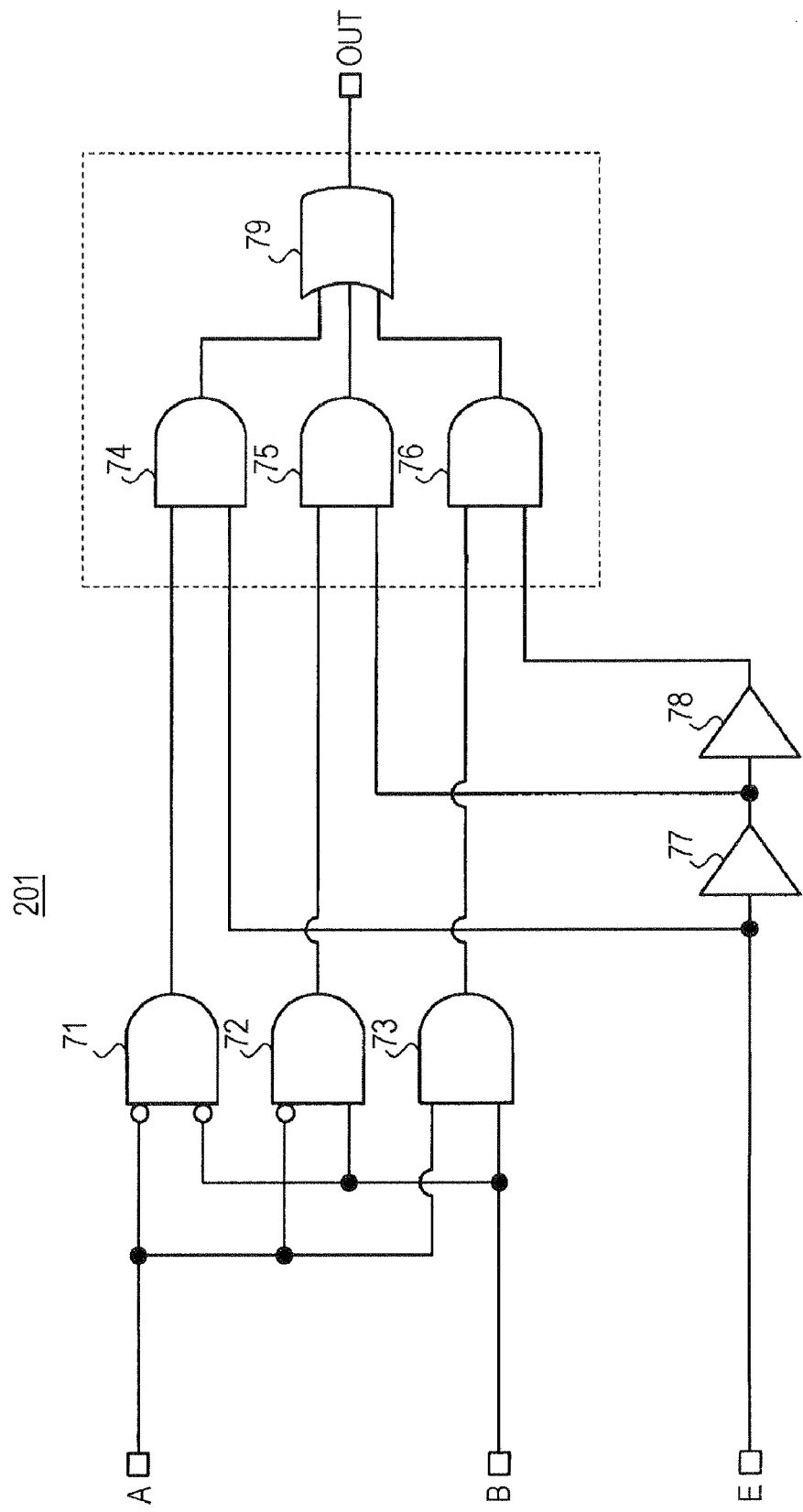
FIG. 19 illustrates a second example of the controlled circuit in the second embodiment.

FIG. 19 is a circuit diagram of a second example of the controlled circuit in the second embodiment. As illustrated in FIG. 19, a controlled circuit 201 in the second example includes, for example, six AND circuits 71, 72, 73, 74, 75, and, 76, two delay circuits 77 and 78, and an OR circuit 79. When signals at both of the terminal A and the terminal B in the delay-difference detecting circuit are high (H), a signal input from the terminal E is output from an output terminal OUT via two delay circuits 77 and 78. When the signal at the terminal A is low (L) and the signal at the terminal B is high (H), a signal input from the terminal E is output from the output terminal OUT via one delay circuit 77. When signals at both of the terminal A and the terminal B are low (L), a signal input from the terminal E is output from the output terminal OUT without going through two delay circuits 77 and 78. The controlled circuit 201 in the second example operates as a circuit for performing control so as to reduce variations in delay.

Figure 20:
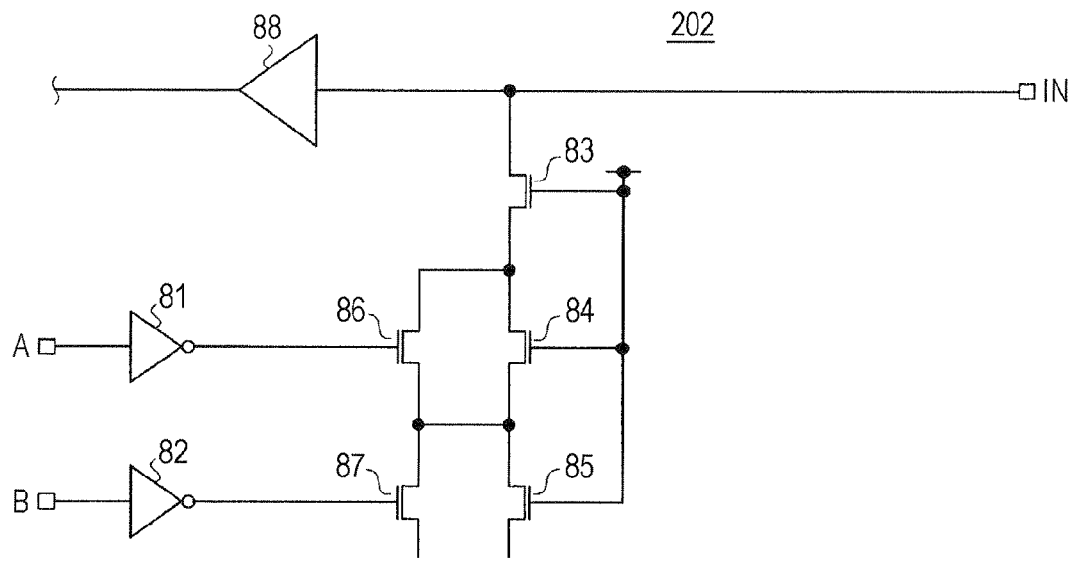
FIG. 20 illustrates a third example of the controlled circuit in the second embodiment.

FIG. 20 is a circuit diagram of a third example of the controlled circuit in the second embodiment. As illustrated in FIG. 20, a controlled circuit 202 in the third example includes, for example, two inverters 81 and 82, five transistors 83, 84, 85, 86, and 87, and a buffer 88 that operates as an input buffer. Three transistors 83, 84, and 85 are coupled in series and operate as pull-down resistors for an input for the buffer 88. When the signals at both of the terminal A and the terminal B of the delay-difference detecting circuit are high (H), three transistors 83, 84, and 85 operate as pull-down resistors. When the signal of terminal A is low (L) and the signal at the terminal B is high (H), two transistors 83 and 85 operate as pull-down resistors. When the signals at both of the terminal A and the terminal B are low (L), one transistor 83 operates as a pull-down resistor. The controlled circuit 202 in the third example operates as a circuit for controlling the value of the pull-down resistance. The pull-down resistors do not necessarily have to be implemented by transistors.

Figure 21:
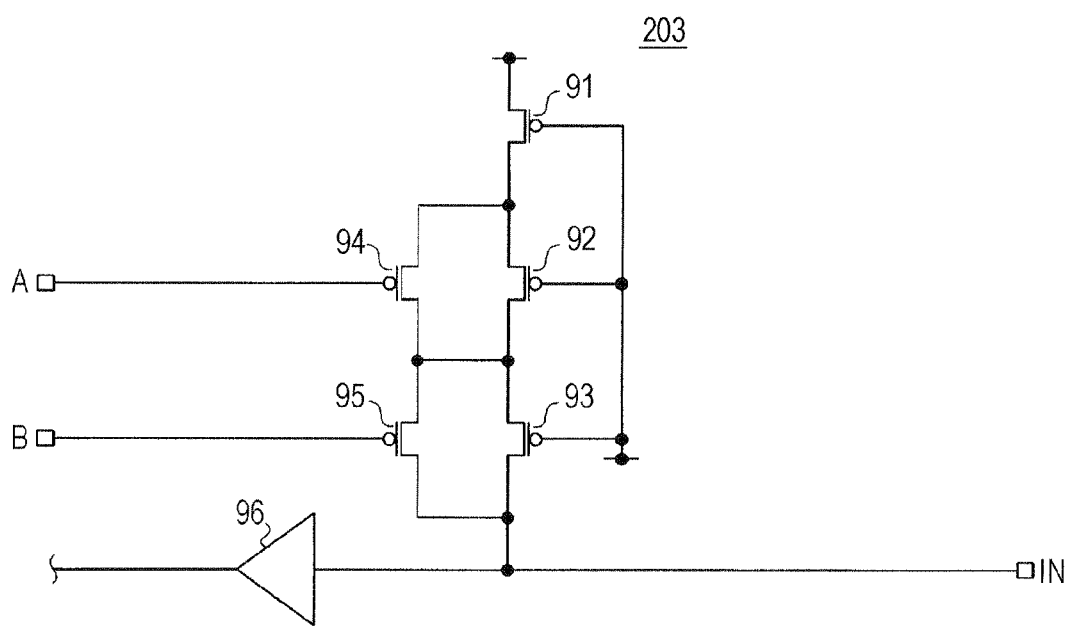
FIG. 21 illustrates a fourth example of the controlled circuit in the second embodiment.

FIG. 21 is a circuit diagram of a fourth example of the controlled circuit in the second embodiment. As illustrated in FIG. 21, a controlled circuit 203 in the fourth example includes, for example, five transistors 91, 92, 93, 94, and 95 and a buffer 96 that operates as an input buffer. Three transistors 91, 92, and 93 are coupled in series and operate as pull-up resistors for an input for the buffer 96. When the signals at both of the terminal A and the terminal B of the delay-difference detecting circuit are high (H), three transistors 91, 92, and 93 operate as pull-up resistors. When the signal at the terminal A is low (L) and the signal at the terminal B is high (H), two transistors 91 and 93 operate as pull-up resistors. When the signals at both of the terminal A and the terminal B are low (L), one transistor 91 operates as a pull-up resistor. The controlled circuit 203 in the fourth example operates as a circuit for controlling the value of the pull-up resistance. The pull-up resistors do not necessarily have to be implemented by transistors.

Figure 22:
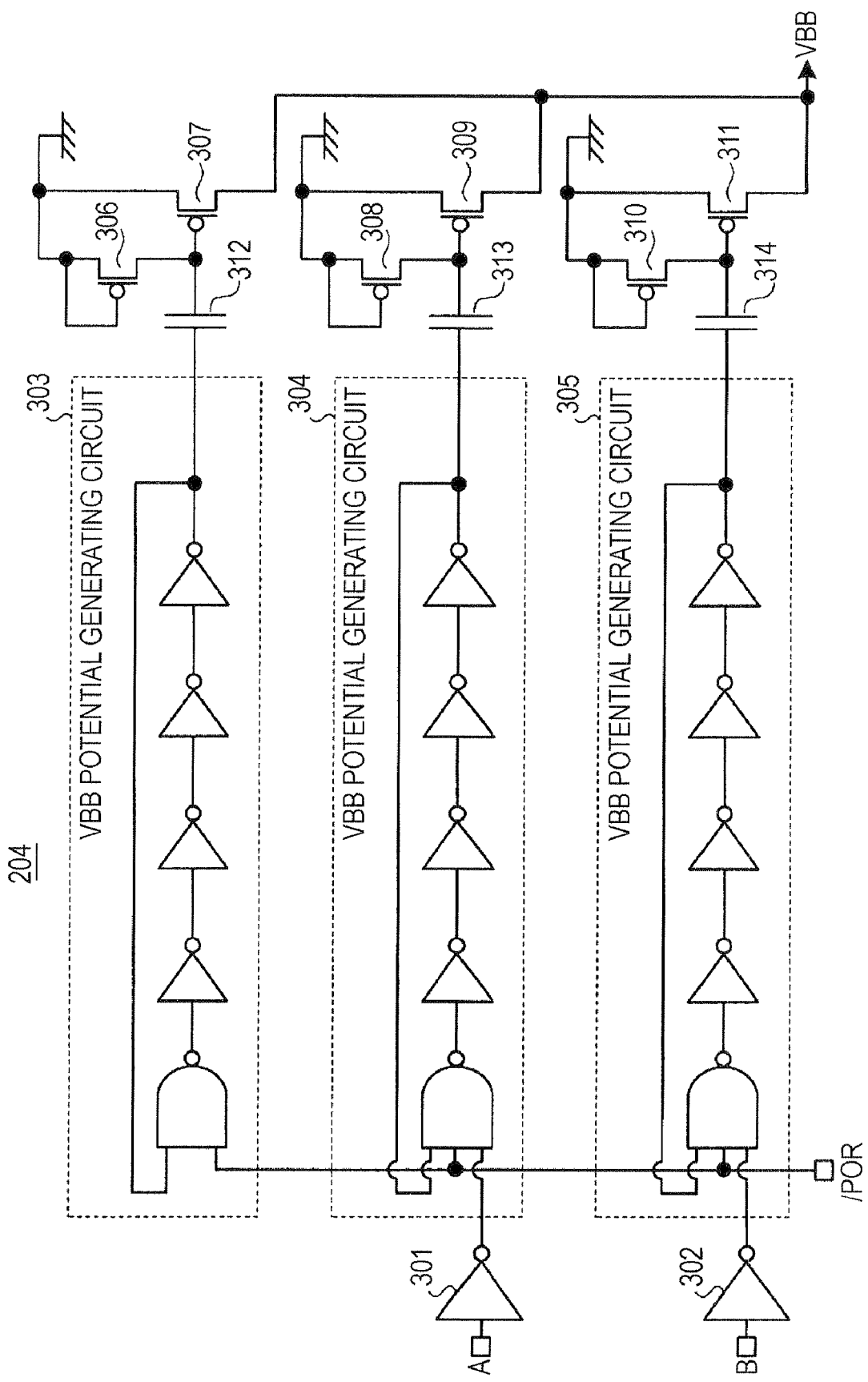
FIG. 22 illustrates a fifth example of the controlled circuit in the second embodiment.

FIG. 22 is a circuit diagram of a fifth example of the controlled circuit in the second embodiment. As illustrated in FIG. 22, a controlled circuit 204 in the fifth example includes, for example, two inverters 301 and 302, three VBB potential generating circuits 303, 304, and 305, six transistors 306, 307, 308, 309, 310, and 311, and three capacitors 312, 313, and 314. When the signals at both of the terminal A and the terminal B of the delay-difference detecting circuit are high (H), one VBB potential generating circuit 303 operates. When the signal at the terminal A is low (L) and the signal at the terminal B is high (H), VBB potential generating circuits 303 and 304 operate. When the signals at both of the terminal A and the terminal B are low (L), VBB potential generating circuits 303, 304, and 305 operate. The controlled circuit 204 in the fifth example operates as a circuit for performing control so as to reduce variations in the VBB potential.

Figure 23:
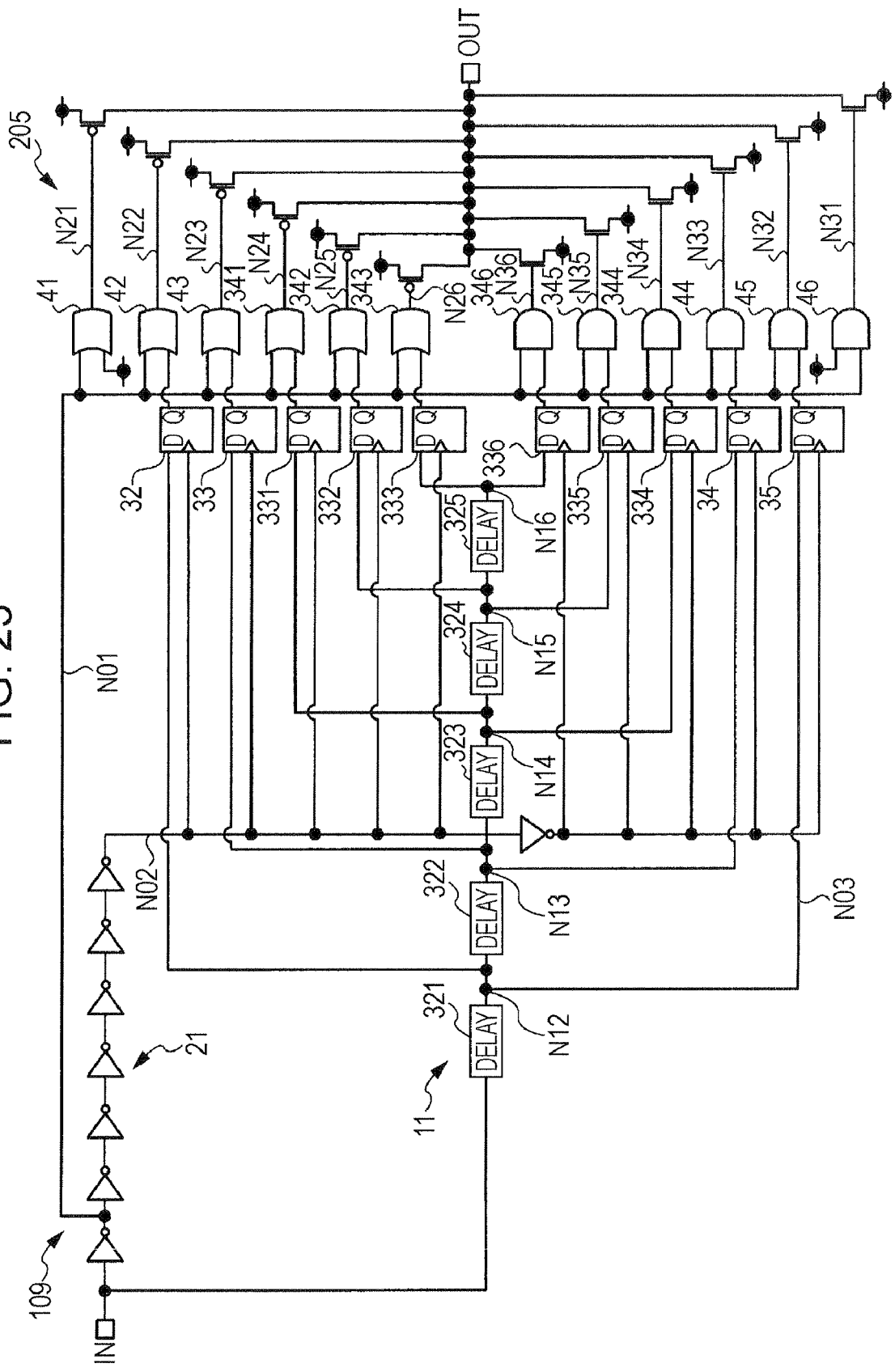
FIG. 23 illustrates a tenth example of the delay-difference detecting circuit in the second embodiment and a sixth example of the controlled circuit.

FIG. 23 is a circuit diagram of a tenth example of the delay-difference detecting circuit according to the second embodiment and a sixth example of the controlled circuit. As illustrated in FIG. 23, a tenth delay-difference detecting circuit 109 has a configuration in which three or more delay elements, for example, first to fifth delay elements 321, 322, 323, 324, and 325 in the illustrated example, are provided as the first inverter array 11 in the first example of the delay-difference detecting circuit illustrated in FIG. 5. The delay elements 321, 322, 323, 324, and 325 correspond to the plurality of inverters 12 and the buffer 17 which are coupled in series between the node N12 and the node N13 in the first example of the delay-difference detecting circuit illustrated in FIG. 5. For convenience of description, a node between the first delay element 321 and the second delay element 322, a node between the second delay element 322 and the third delay element 323, a node between the third delay element 323 and the fourth delay element 324, and a node between the fourth delay element 324 and the fifth delay element 325 are indicated as N12, N13, N14, and N15, respectively. An end point of the first inverter array 11 is indicated as a node N16.

The number of sequential circuits is also increased so as to correspond to an increased number of delay element stages in the first inverter array 11. In the illustrated example, a fifth flip-flop circuit 331, a sixth flip-flop circuit 332, and a seventh flip-flop circuit 333 are added to the first example illustrated in FIG. 5. At the rising edge of the node N02, outputs of the node N14, the node N15, and the node N16 are supplied to the fifth flip-flop circuit 331, the sixth flip-flop circuit 332, and the seventh flip-flop circuit 333, respectively. Further, an eighth flip-flop circuit 334, a ninth flip-flop circuit 335, and a tenth flip-flop circuit 336 are added. At the rising edge of the node N03, outputs of the node N14, the node N15, and the node N16 are supplied to the eighth flip-flop circuit 334, the ninth flip-flop circuit 335, and the tenth flip-flop circuit 336.

As illustrated in FIG. 23, a controlled circuit 205 in the sixth example has a configuration in which a fourth OR circuit 341, a fifth OR circuit 342, and a sixth OR circuit 343, which respectively correspond to the fifth flip-flop circuit 331, the sixth flip-flop circuit 332, and the seventh flip-flop circuit 333, are added to the first example of the controlled circuit illustrated in FIG. 6. Further, a fourth AND circuit 344, a fifth AND circuit 345, and a sixth AND circuit 346, which respectively correspond to the eighth flip-flop circuit 334, the ninth flip-flop circuit 335, and the tenth flip-flop circuit 336, are added to the first example of the controlled circuit illustrated in FIG. 6. For convenience of description, output nodes of the fourth OR circuit 341, the fifth OR circuit 342, the sixth OR circuit 343, the fourth AND circuit 344, the fifth AND circuit 345, and the sixth AND circuit 346 are indicated as N24, N25, N26, N34, N35, and N36, respectively.

Figure 24:
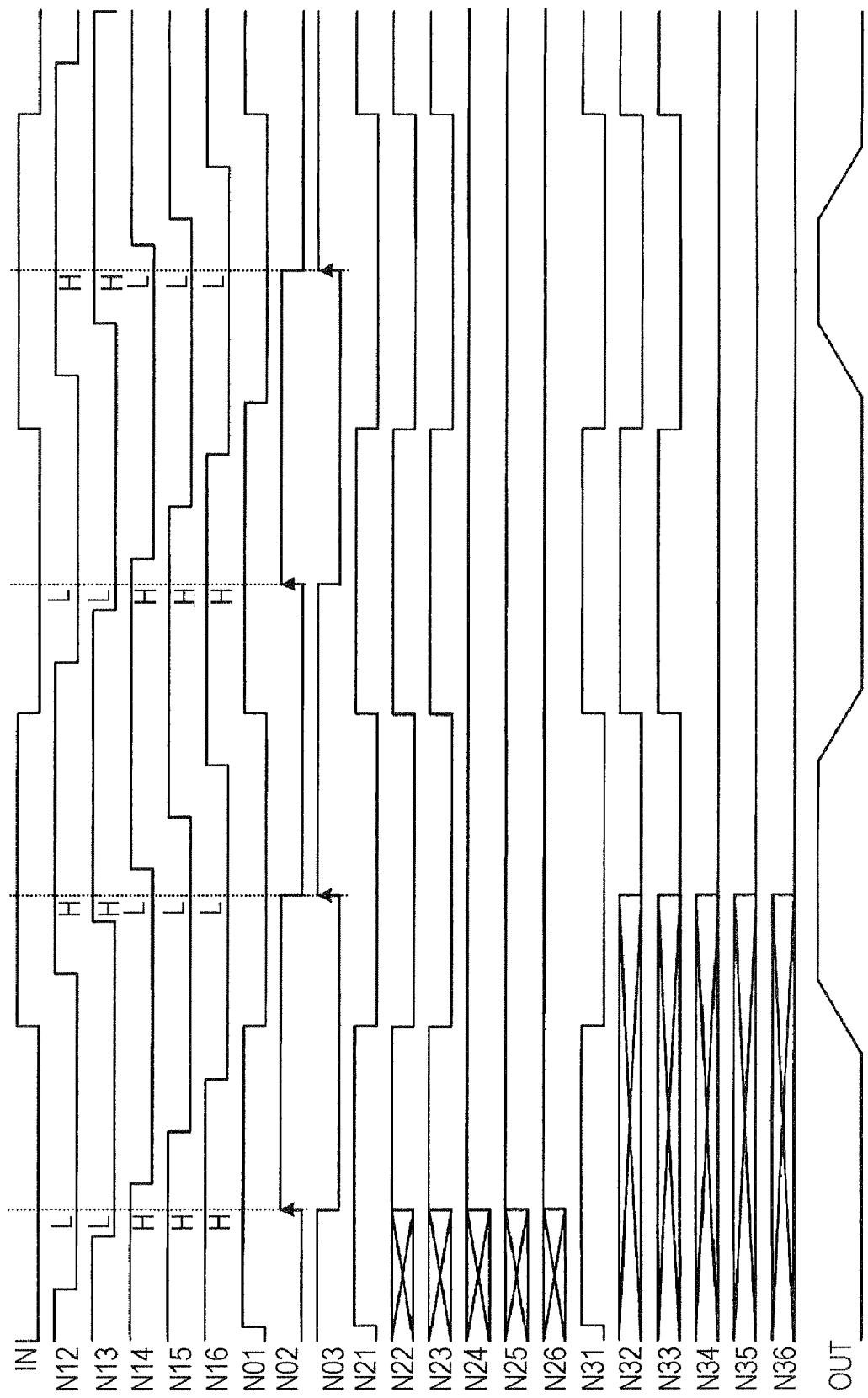
FIG. 24 illustrates an operation when the tenth example of the delay-difference detecting circuit in the second embodiment and the sixth example of the controlled circuit are used.

FIG. 24 is a timing diagram illustrating an operation when the tenth example of the delay-difference detecting circuit according to the second embodiment and the sixth example of the controlled circuit are used. As illustrated in FIG. 24, when the amount of delay is standard, for example, the signals at the nodes N12 and N13 are low (L) and the signals at the nodes N14, N15, and N16 are high (H) at the rising edge of the node N02. For example, at the rising edge of the node N03, the signals of the node N12 and the node N13 are high (H) and the signals at the nodes N14, N15, and N16 are low (L). As the amount of delay increases relative to the standard amount, the number of nodes at which the signals are low (L) decreases and the number of nodes at which the signals at high (H) increases at the rising edge of the node N02. As the amount of delay increases relative to the standard amount, the number of nodes at which the signals are high (H) decreases and the number of nodes at which the signals are low (L) increases at the rising edge of the node N03. Conversely, as the amount of delay decreases relative to the standard amount, the number of nodes at which the signals are low (L) increases and the number of nodes at which the signals are high (H) decreases at the rising edge of the node N02. As the amount of delay decreases relative to the standard amount, the number of nodes at which the signals are high (H) increases and the number of nodes at which the signals are low (L) decreases at the rising edge of the node N03.

Increasing the number of delay element stages in the first inverter array 11 in the manner described above makes it possible to more accurately control the controlled circuit. The number of delay element stages in the first inverter array 11 may be three, four, six, or more. The number of delay element stages in the first inverter array 11 also corresponds to the number of sequential circuits, the number of OR circuits, and the number of AND circuits. Three, four, six, or more delay-element stages in the first inverter array 11 may be provided in a configuration in which one of the first to ninth examples of the delay-difference detecting circuit and one of the first to fifth examples of the controlled circuit are combined.

Figure 25:
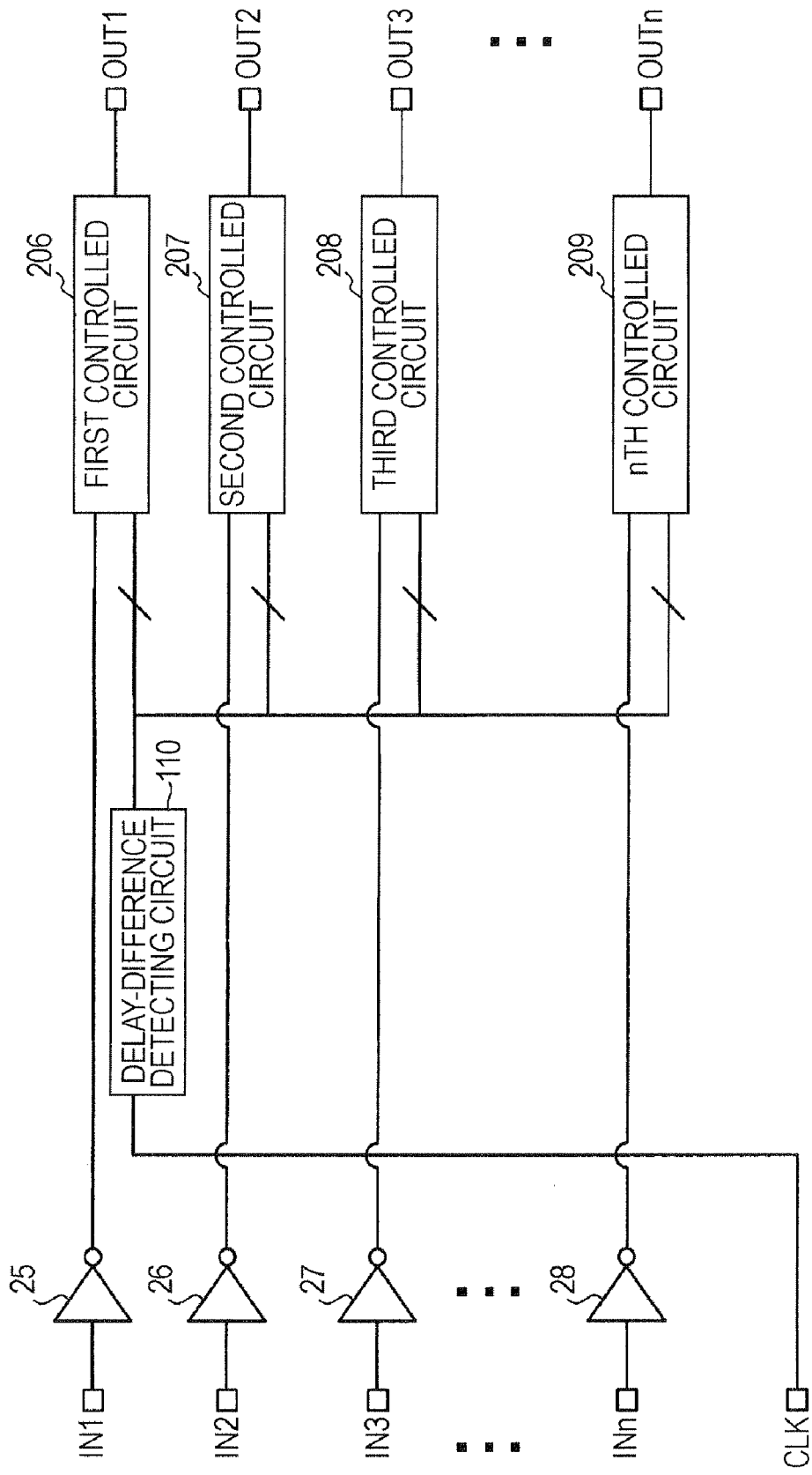
FIG. 25 illustrates an example in which the single delay-difference detecting circuit in the second embodiment controls a plurality of controlled circuits.

FIG. 25 is a circuit diagram of an example in which the single delay-difference detecting circuit according to the second embodiment controls a plurality of controlled circuits. As illustrated in FIG. 25, the semiconductor integrated circuit may have a configuration in which a single delay-difference detecting circuit 110 controls a plurality of controlled circuits 206, 207, 208, and 209. In this case, the delay-difference detecting circuit 110 may be, for example, the delay-difference detecting circuit 108 in the ninth example illustrated in FIG. 17. The arrangement may also be such that the delay-difference detecting circuit 110 is coupled to an input terminal CLK for a clock signal, instead of the initial signal in the delay-difference detecting circuit 108 in the ninth example, so as to provide a delayed signal by using the falling and rising edges of the clock signal. When the delay-difference detecting circuit 110 is to detect a delay state, the clock signal goes from high (H) to low (L) and goes from low (L) to high (H). The controlled circuits 206, 207, 208, and 209 may be, of the above-described controlled circuits, the circuits having the same configuration or the circuits having different configurations. Signals are input to the first controlled circuit 206, the second controlled circuit 207, the third controlled circuit 208, and the nth controlled circuit 209 via an input terminal IN1, an input terminal IN2, an input terminal IN3, and an input terminal INn, respectively, and inverters 25, 26, 27, and 28 invert the corresponding input signals. The inverters 25, 26, 27, and 28 correspond to the third inverter 24 in the delay-difference detecting circuit 108 in the ninth example.

Figure 26:
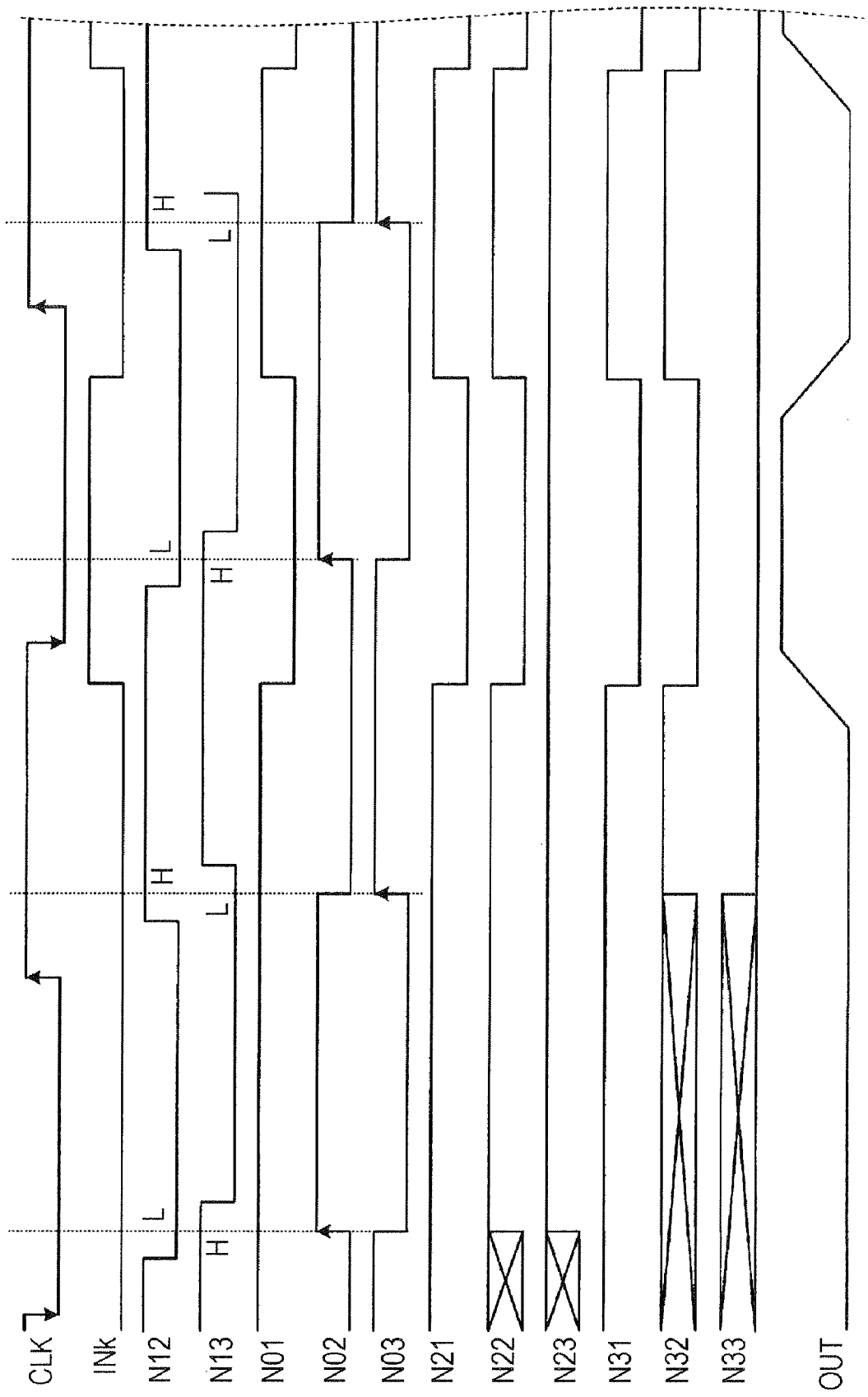
FIG. 26 illustrates an operation in an example in which the single delay-difference detecting circuit in the second embodiment controls a plurality of controlled circuits.
Figure 27:
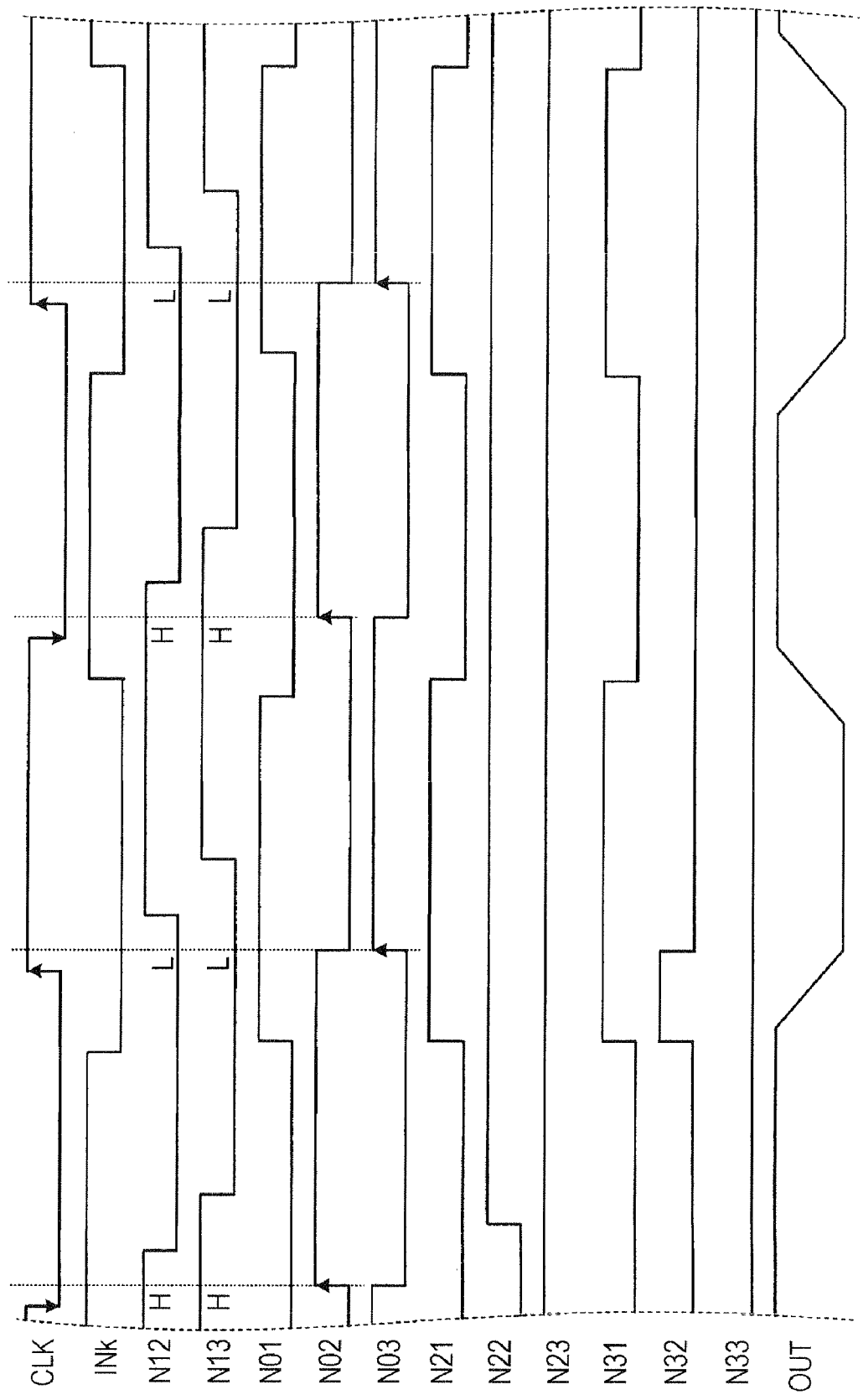
FIG. 27 illustrates an operation in an example in which the single delay-difference detecting circuit in the second embodiment controls a plurality of controlled circuits.
Figure 28:
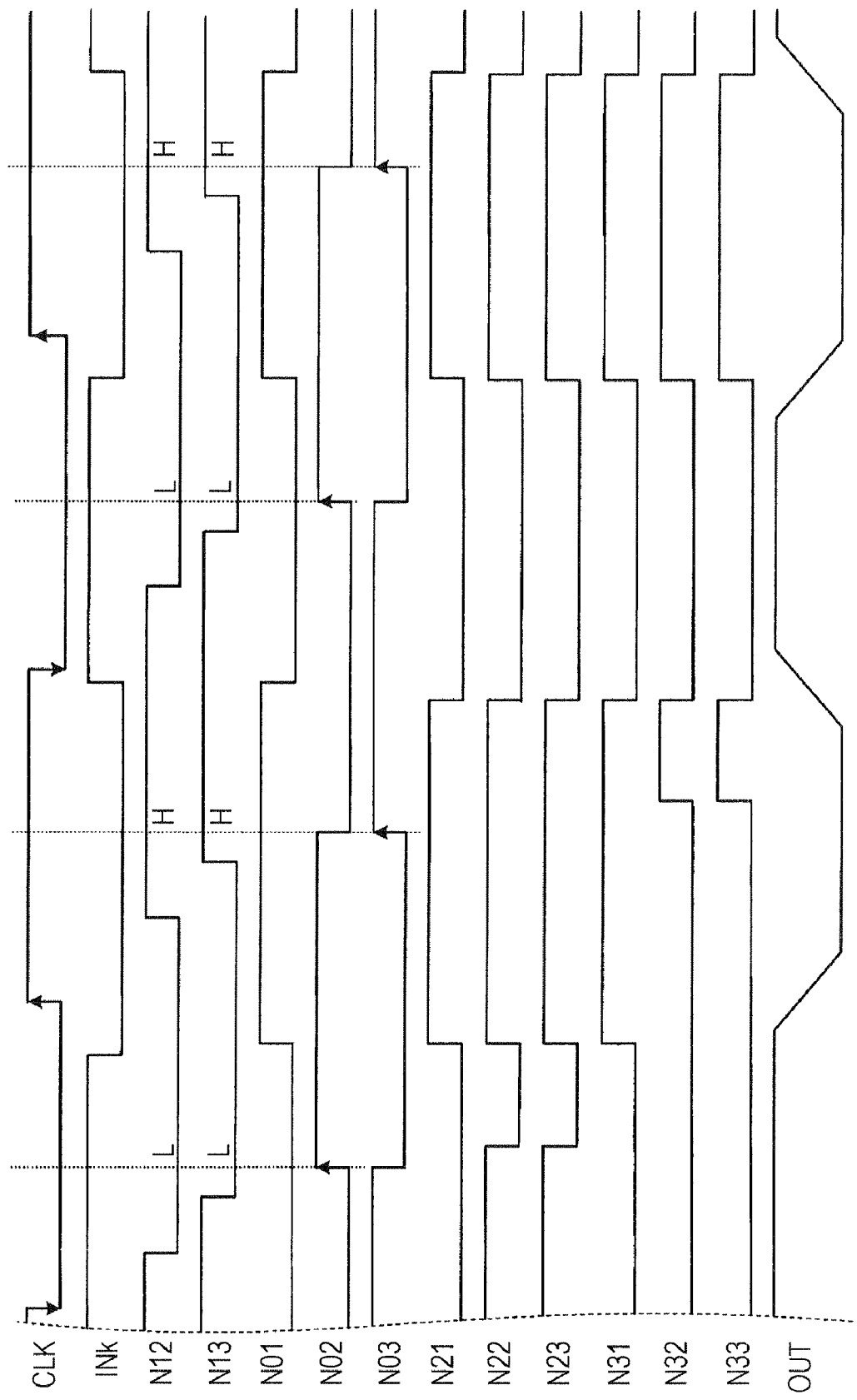
FIG. 28 illustrates an operation in an example in which the single delay-difference detecting circuit in the second embodiment controls a plurality of controlled circuits.

FIGS. 26 to 28 are timing diagrams of the example in which the single delay-difference detecting circuit according to the second embodiment controls a plurality of controlled circuits. FIG. 27 is a continuation of FIG. 26, and FIG. 28 is a continuation of FIG. 27. In FIGS. 26 to 28, INk indicates behavior of an input terminal of the kth one of the plurality of controlled circuits. Thus, N01 represents behavior of an output node of the third inverter for inverting the signal input from the input terminal INk to the kth controlled circuit, where k is an integer of 1 to n. In this case, for example, the delay-difference detecting circuit 110 is the delay-difference detecting circuit 108 in the ninth example illustrated in FIG. 17 and the kth controlled circuit is the controlled circuit 200 in the first example illustrated in FIG. 6. FIG. 26 illustrates behavior when the amount of delay is standard. FIG. 27 illustrates behavior when the amount of delay changes from a state in which the amount of delay is standard to a state in which the amount of delay is larger than that in the standard state. FIG. 28 illustrates behavior when the amount of delay changes from a state in which the amount of delay is larger than the standard amount to a state in which the amount of delay is smaller than the standard amount.

According to the second embodiment, since the delay-difference detecting circuit may detect the amount of delay, it may be possible to detect variations in the process conditions and changes in a voltage and a temperature in the circuitry. It is also possible to simplify the configuration of a circuit for detecting variations in the process conditions and changes in the voltage and temperature in the circuitry. In addition, since the delay-difference detecting circuit includes the inverters, no steady-state current flows. Thus, it may be possible to reduce power consumption. Since the configuration of the first example of the controlled circuit may control the slew rate, the configuration of the first example may be applied to a device having fixed maximum and minimum slew rates. One example of a standard in which the maximum and minimum slew rates are defined is an ATA standard called "Additional AC characteristics for Ultra DMA modes greater than mode 4". Logical circuits, such as NAND circuits and/or NOR circuits, may be used instead of the inverters 12 in the first inverter array 11. Logical circuits, such as NAND circuits and/or NOR circuits, may also be used instead of the CMOS inverters 23 in the second inverter array 21.

In the delay-difference detecting circuit according to the second embodiment, when the process conditions vary, a speed at which one of the p-channel transistor and the n-channel transistor is turned on may become higher than a standard speed, and a speed at which the other transistor is turned on may become lower than the standard speed. A semiconductor integrated circuit according to a third embodiment has a delay-difference detecting circuit for detecting the amount of delay in such a case. For example, when the process conditions conform to designed process conditions, the speeds at which the transistors are turned on are standard. In a description below, configurations that are the same as those in the second embodiment described above are denoted by the same reference numerals as in the second embodiment, and redundant descriptions are not given hereinafter.

Figure 29:
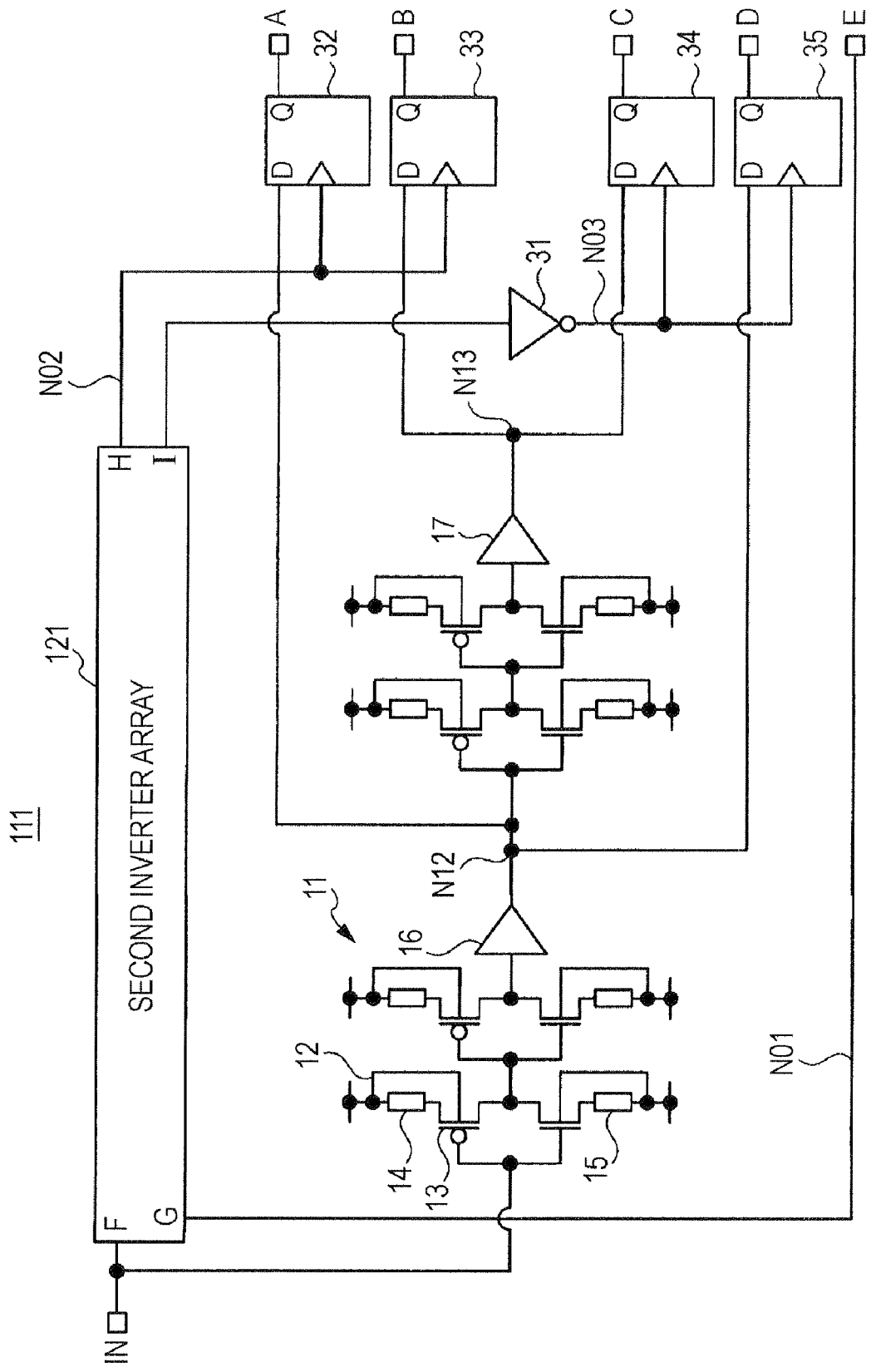
FIG. 29 illustrates one example of a delay-difference detecting circuit in a third embodiment.

FIG. 29 is a circuit diagram of one example of the delay-difference detecting circuit according to the third embodiment. As illustrated in FIG. 29, a delay-difference detecting circuit 111 has a first inverter array 11, which has substantially the same configuration as in the second embodiment. The delay-difference detecting circuit 111 has a second inverter array 121 described below. A terminal F of the second inverter array 121 is coupled to an input terminal IN of the delay-difference detecting circuit 111. A terminal G of the second inverter array 121 is coupled to a terminal E. A terminal H of the second inverter array 121 is coupled to a clock terminal of a first flip-flop circuit 32 and a clock terminal of a second flip-flop circuit 33. A terminal I of the second inverter array 121 is coupled to an input node of a second inverter 31. An output node of the second inverter 31 is coupled to a clock terminal of a third flip-flop circuit 34 and a clock terminal of a fourth flip-flop circuit 35. In the third embodiment, a node N01 corresponds to the terminal G (e.g., the terminal E) and a node N02 corresponds to the terminal H, and a node N03 corresponds to an output node of the second inverter 31.

Figure 30:
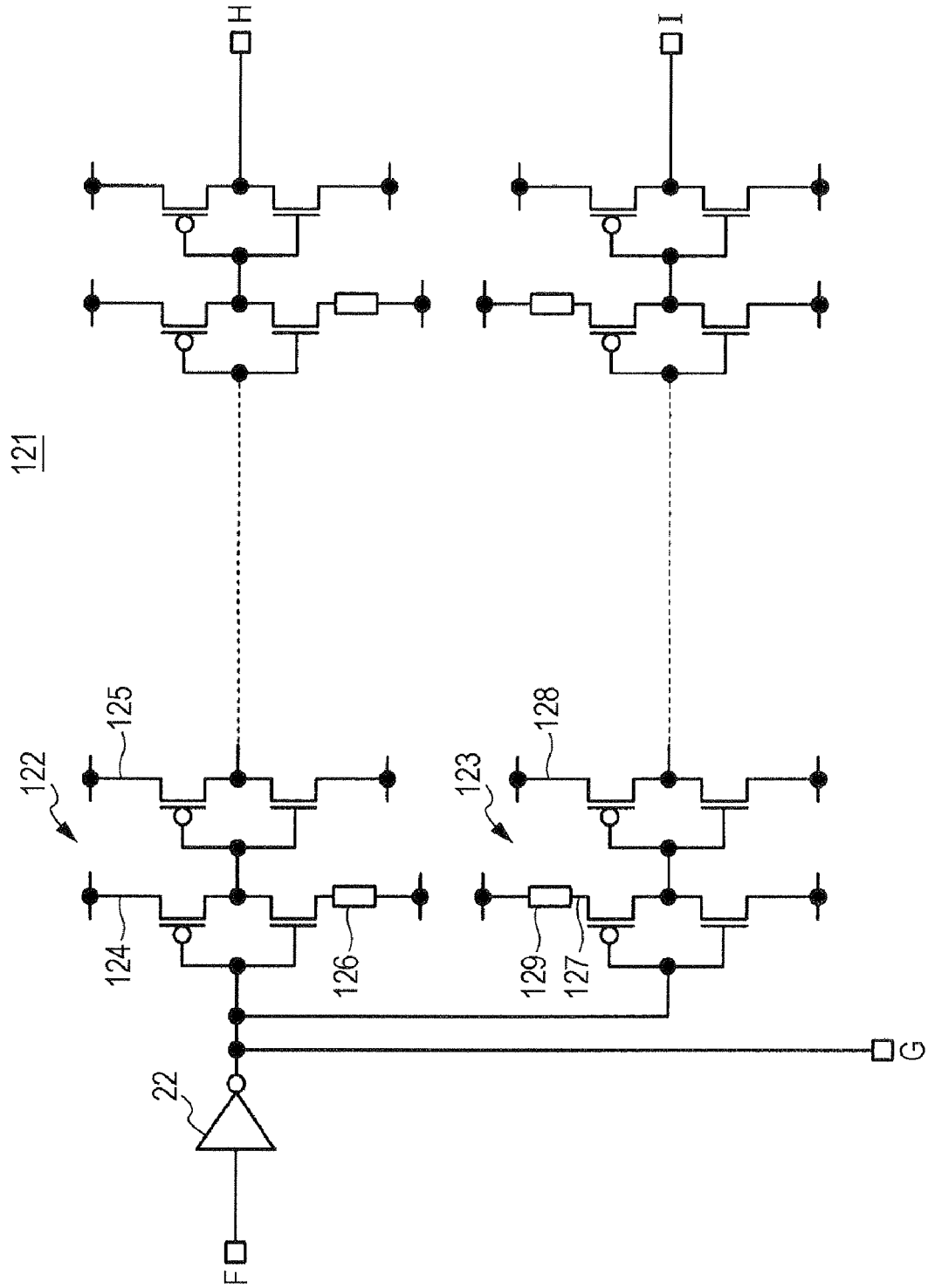
FIG. 30 illustrates one example of a second inverter array in the third embodiment.

FIG. 30 is a circuit diagram of one example of the second inverter array in the third embodiment. As illustrated in FIG. 30, the second inverter array 121 includes a first inverter 22, a second inverter array (P) 122, and a second inverter array (N) 123. The second inverter array (P) 122 serves as a circuit for detecting variations in the process conditions of the p-channel transistors. The second inverter array (N) 123 serves as a circuit for detecting variations in the process conditions of the n-channel transistors. An input node of the first inverter 22 is coupled to the terminal F. An output node of the first inverter 22 is coupled to the terminal G, a start point of the second inverter array (P) 122, and a start point of the second inverter array (N) 123. An end point of the second inverter array (P) 122 is coupled to the terminal H. An end point of second inverter array (N) 123 is coupled to the terminal I.

An even number of CMOS inverters 124 and 125 are coupled in series between the start point and the end point of the second inverter array (P) 122. The CMOS inverters 124 and 125 operate as delay elements. A resistance element 126 is coupled to a ground-potential side of the odd-numbered inverter 124 counted from the start-point side of the second inverter array (P) 122. The resistance value of the resistance element 126 is large enough that variations in the on-resistance of the p-channel transistor may be ignored. Variations in the resistance value of the resistance element 126 are small compared to variations in the on-resistance of the p-channel transistor. The resistance element 126 is made of, for example, polysilicon, but is not limited thereto. When a signal input to the odd-numbered inverter 124 is high (H), the resistance element 126 is coupled to the signal path and thus an output signal of the odd-numbered inverter 124 goes low (L). When the output signal of the odd-numbered inverter 124 goes low (L), the signal input to the even-numbered inverter 125 goes low (L) and thus an output signal of the even-numbered inverter 125 goes high (H). This operation is repeated up to the even-numbered inverter 125 at the last stage in the second inverter array (P) 122, so that the signal at the terminal H, e.g., the node N02, goes high (H).

Since the resistance element 126 is coupled to the n-channel transistor in the odd-numbered inverter 124, the speed at which the n-channel transistor in the odd-numbered inverter 124 is turned on is substantially equal to standard speed. On the other hand, since no resistance element is coupled to the p-channel transistor in the even-numbered inverter 125, the speed at which the p-channel transistor in the even-numbered inverter 125 is turned on is affected by, for example, variations in the process conditions of the p-channel transistor. That is, the speed at which the p-channel transistor in the even-numbered inverter 125 is turned on may become higher or lower than the standard speed.

An even number of CMOS inverters 127 and 128 are coupled in series between the start point and the end point of the second inverter array (N) 123. The CMOS inverters 127 and 128 operate as delay elements. A resistance element 129 is coupled to a power-supply potential side of the odd-numbered inverter 127 counted from the start-point side of the second inverter array (N) 123. A resistance value of the resistance element 129 is large enough that variations in the on-resistances of the n-channel transistors may be ignored. Variations in the resistance value of the resistance element 129 are small compared to variations in the on-resistances of the n-channel transistors. The resistance element 129 is made of, for example, polysilicon, but is not limited thereto. When a signal input to the odd-numbered inverter 127 is low (L), the resistance element 129 is coupled to the signal path and thus an output signal of the odd-numbered inverter 127 goes high (H). When the output signal of the odd-numbered inverter 127 goes high (H), the signal input to the even-numbered inverter 128 goes high (H) and thus an output signal of the even-numbered inverter 128 goes low (L). This operation is repeated up to the even-numbered inverter 128 at the last stage in the second inverter array (N) 123, so that the signal at the terminal I goes low (L).

Since the resistance element 129 is coupled to the p-channel transistor in the odd-numbered inverter 127, the speed at which the p-channel transistor in the odd-numbered inverter 127 is turned on is substantially equal to a standard speed. On the other hand, since no resistance element is coupled to the n-channel transistor in the even-numbered inverter 128, the speed at which the n-channel transistor in the even-numbered inverter 128 is turned on is affected by, for example, variations in the process conditions of the n-channel transistor. That is, the speed at which the n-channel transistor in the even-numbered inverter 128 is turned on may become higher or lower than the standard speed.

In the second inverter array (P) 122, the resistance element 126 coupled to the n-channel transistor in the odd-numbered inverter 124 may be coupled to a source terminal or a drain terminal of the n-channel transistor. In the second inverter array (P) 122, a source line of the n-channel transistor of the odd-numbered inverter 124 may be made of polysilicon. A resistance value of the source line may be larger than a resistance value of the drain line of the p-channel transistor in the even-numbered inverter 125. In the second inverter array (N) 123, the resistance element 129 coupled to the p-channel transistor in the odd-numbered inverter 127 may be coupled to a source terminal or a drain terminal of the p-channel transistor. In the second inverter array (N) 123, a source line of the p-channel transistor of the odd-numbered inverter 127 may be made of polysilicon. A resistance value of the source line may be larger than a resistance value of the drain line of the n-channel transistor in the even-numbered inverter 128.

The operation of the delay-difference detecting circuit according to the third embodiment will now be described in conjunction with an example in which the delay-difference detecting circuit according to the third embodiment is combined with the first example (see FIG. 6) of the controlled circuit according to the second embodiment. When the amount of delay in the p-channel transistors and the amount of delay in the n-channel transistors are standard, the signal at the node N12 is low (L) and the signal at the node N13 is high (H) when the signal at the node N02 goes from low (L) to high (H), as illustrated in FIG. 7. In order to satisfy such a relationship, the number of inverters 12 in the first inverter array 11 in the delay-difference detecting circuit 111 is adjusted. The number of inverters 124 and 125 in the second inverter array (P) 122 in the second inverter array 121 is also adjusted. When the signal at the node N03 goes from low (L) to high (H), the signal at the node N12 is high (H) and the signal at the node N13 is low (L). In order to satisfy such a relationship, the number of inverters 12 in the first inverter array 11 in the delay-difference detecting circuit 111 is adjusted. The number of inverters 127 and 128 in the second inverter array (N) 123 in the second inverter array 121 is also adjusted.

When the amount of delay in the p-channel transistors and the amount of delay in the n-channel transistors are standard, for example, the first PMOS transistor 51 and the second PMOS transistor 52 operate in the controlled circuit 200 in the first example. The third PMOS transistor 53 does not operate. The second NMOS transistor 55 and the third NMOS transistor 56 also operate. The first NMOS transistor 54 does not operate. That is, two of the PMOS transistors and two of the NMOS transistors in the controlled circuit 200 are driven, so that a signal having the same level as the signal input to the input terminal IN of the delay-difference detecting circuit 111 is output from the output terminal OUT.

Figure 31:
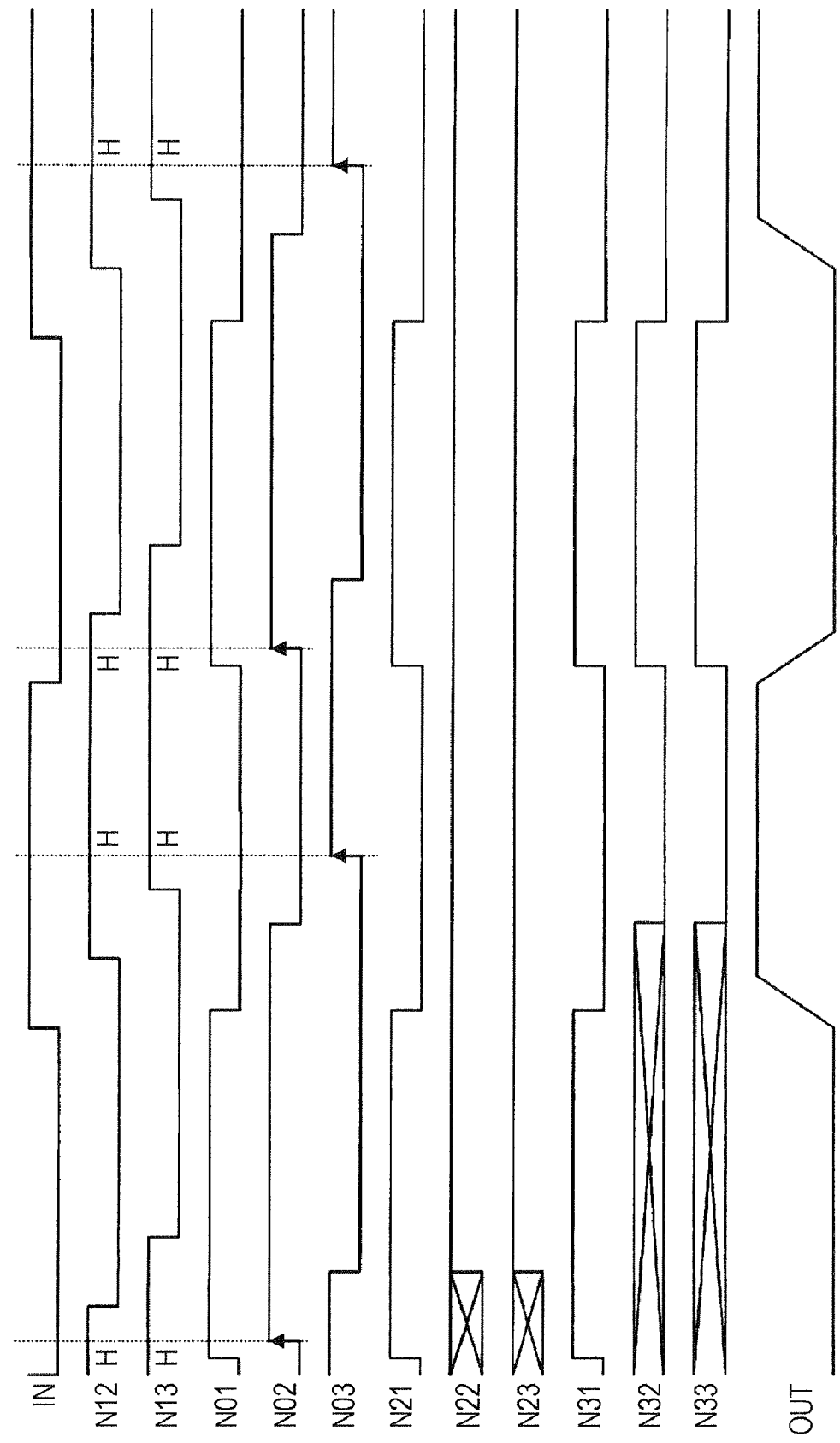
FIG. 31 illustrates an operation of a semiconductor integrated circuit according to the third embodiment.

FIG. 31 is a timing diagram of an operation of the semiconductor integrated circuit according to the third embodiment. In this operation, the speed at which the p-channel transistor is turned on is higher than the standard speed and the speed at which the n-channel transistor is turned on is lower than the standard speed. As illustrated in FIG. 31, when the signal at the node N01 goes from low (L) to high (H), the n-channel transistor in the odd-numbered inverter 124 in the second inverter array (P) 122 is turned on at the standard speed, since the n-channel transistor is coupled to the resistance element 126. Correspondingly, the p-channel transistor in the even-numbered inverter 125 in the second inverter array (P) 122 is turned on at a higher speed than the standard speed. Thus, the signal at the terminal H, e.g., the node N02, goes from low (L) to high (H) earlier than in the case in FIG. 7, and the signals at both of the nodes N12 and N13 go high (H). In order to satisfy such a relationship, the number of inverters 12 in the first inverter array 11 in the delay-difference detecting circuit 111 is adjusted. The number of inverters 124 and 125 in the second inverter array (P) 122 in the second inverter array 121 is also adjusted.

On the other hand, when the signal at the node N01 goes from high (H) to low (L), the p-channel transistor in the odd-numbered inverter 127 in the second inverter array (N) 123 is turned on at a standard speed, since the p-channel transistor is coupled to the resistance element 129. Correspondingly, the n-channel transistor in the even-numbered inverter 128 in the second inverter array (N) 123 is turned on later than the standard speed. The level of the node N03 is a level obtained by the second inverter 31 inverting the level of the terminal I. Thus, the signal at the node N03 goes from low (L) to high (H) later than in the case in FIG. 7, and the signals at both of the nodes N12 and N13 go high (H). In order to satisfy such a relationship, the number of inverters 12 in the first inverter array 11 in the delay-difference detecting circuit 111 is adjusted. The number of inverters 127 and 128 in the second inverter array (N) 123 in the second inverter array 121 is also adjusted.

The states of the nodes N21, N22, and N23 when the signals at both of the nodes N12 and N13 are high (H) while the signal at the node N02 goes from low (L) to high (H) are analogous to those in the operation illustrated in FIG. 8. Thus, the first PMOS transistor 51 operates and the second PMOS transistor 52 and the third PMOS transistor 53 do not operate. The states of the nodes N31, N32, and N33 when the signals at both of the nodes N12 and N13 are high (H) while the signal at the node N03 goes from low (L) to high (H) are analogous to those in the operation illustrated in FIG. 9. Thus, the first NMOS transistor 54, the second NMOS transistor 55, and the third NMOS transistor 56 operate. Consequently, the number of PMOS transistors that operate decreases in the controlled circuit 200 so that the driving capability of the PMOS transistors decreases. On the other hand, since the number of NMOS transistors that operates increases, the driving capability of the NMOS transistors increases. Thus, for example, it may be possible to eliminate imbalanced slew rates of the controlled circuit 200 which are caused by variations in the process conditions.

Figure 32:
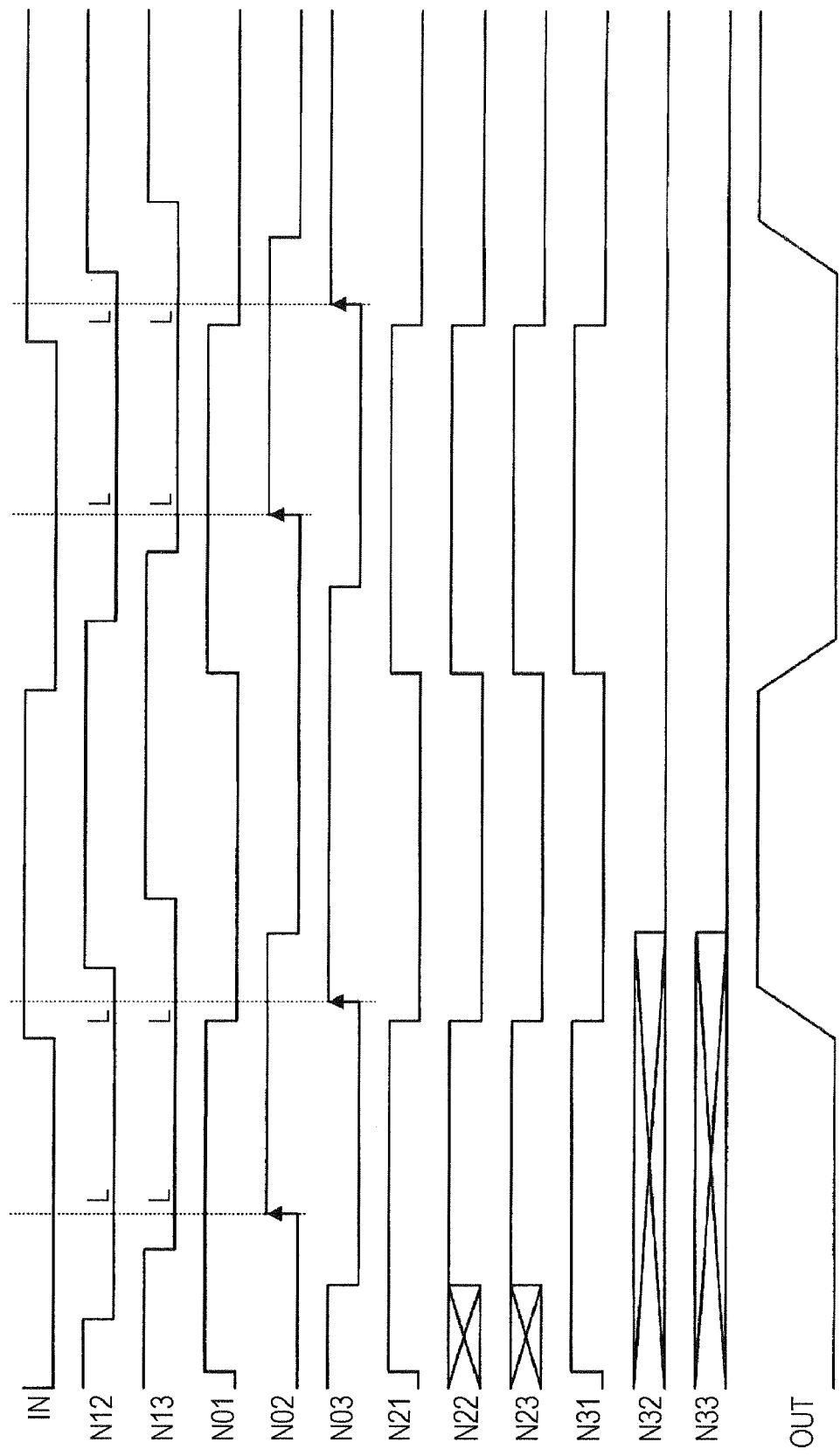
FIG. 32 illustrates an operation of the semiconductor integrated circuit according to the third embodiment.

FIG. 32 is a timing diagram of an operation of the semiconductor integrated circuit according to the third embodiment. In this operation, the speed at which the p-channel transistors are turned on is lower than the standard speed, and the speed at which the n-channel transistors are turned on is higher than the standard speed. As illustrated in FIG. 32, when the signal at the node N01 goes from low (L) to high (H), the n-channel transistor in the odd-numbered inverter 124 in the second inverter array (P) 122 is turned on at a standard speed. Correspondingly, the p-channel transistor in the even-numbered inverter 125 in the second inverter array (P) 122 is turned on at a lower speed than the standard speed. Thus, the signal at the node N02 goes from low (L) to high (H) late compared to the case in FIG. 7, and both of the nodes N12 and N13 go low (L). In order to satisfy such a relationship, the number of inverters 12 in the first inverter array 11 in the delay-difference detecting circuit 111 is adjusted. The number of inverters 124 and 125 in the second inverter array (P) 122 in the second inverter array 121 is also adjusted.

On the other hand, when the signal at the node N01 goes from high (H) to low (L), the p-channel transistor in the odd-numbered inverter 127 in the second inverter array (N) 123 is turned on at a standard speed. Correspondingly, the n-channel transistor in the even-numbered inverter 128 in the second inverter array (N) 123 is turned on at a higher speed than the standard speed. Thus, the signal at the node N03 goes from low (L) to high (H) earlier compared to the case in FIG. 7, and the signals at both of the nodes N12 and N13 go low (L). In order to satisfy such a relationship, the number of inverters 12 in the first inverter array 11 in the delay-difference detecting circuit 111 is adjusted. The number of inverters 127 and 128 in the second inverter array (N) 123 in the second inverter array 121 is also adjusted.

The states of the nodes N21, N22, and N23 when the signals at both of the nodes N12 and N13 are low (L) while the signal at the node N02 goes from low (L) to high (H) are analogous to those in the operation illustrated in FIG. 9. Thus, the first PMOS transistor 51, the second PMOS transistor 52, and the third PMOS transistor 53 operate. The states of the nodes N31, N32, and N33 when the signals at both of the nodes N12 and N13 are low (L) while the signal at the node N03 goes from low (L) to high (H) are analogous to those in the operation illustrated in FIG. 8. Thus, the third NMOS transistor 56 operates and the first NMOS transistor 54 and the second NMOS transistor 55 do not operate. Consequently, the number of PMOS transistors that operate increases in the controlled circuit 200 so that the driving capability of the PMOS transistors increases. On the other hand, since the number of NMOS transistors that operates decreases, the driving capability of the NMOS transistors decreases. Thus, for example, it may be possible to eliminate imbalanced slew rates of the controlled circuit 200 which are caused by variations in the process conditions.

The third embodiment offers the same advantages of the second embodiment. In addition, even when characteristics of the p-channel transistors and the characteristics of the n-channel transistors vary in opposite directions as a result of variations in the process conditions and so on, the delay-difference detecting circuit may detect the amount of delay. Logical circuits, such as NAND circuits and/or NOR circuits, may also be used instead of the inverters 124, 125, 127, and, 128 in the second inverter array 121. The delay-difference detecting circuit 111 according to the third embodiment may be applied to, for example, a configuration in which the first inverter array 11 includes three or more delay elements 321, 322, 323, 324, and 325, as illustrated in FIG. 23. The delay-difference detecting circuit 111 in the third embodiment may also be applied to, for example, a configuration in which controlled circuits 206, 207, 208, and 209 are controlled, as illustrated in FIG. 25.

The semiconductor integrated circuit and the signal adjusting method provide an advantage in that it may be possible to detect changes in the operating conditions, such as a voltage and a temperature, of a circuitry. The semiconductor integrated circuit also offers an advantage in that the configuration is simplified.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

What is claimed is:

1. A semiconductor device comprising:
a first signal generator that generates a plurality of second signals having a delay relative to a first signal and having states that change at different timings;
a second signal generator that generates a third signal having a delay relative to the first signal; and
a detector that detects a delay amount based on the states of the second signals when a state of the third signal changes,
wherein the first signal generator and the second signal generator are different from each other in an amount of change in delay relative to a change in an operating state, and the first signal generator has a smaller amount of change in delay relative to a change in the operating state than that of the second signal generator.

2. The semiconductor device according to claim 1,
wherein the first signal generator includes a first inverter array in which a plurality of inverter sections are coupled in series, and
wherein each inverter section in the first inverter array includes
a first resistance element coupled to a high potential side,
a second resistance element coupled to a low potential side, and
a switching element that electrically disconnects one of the first resistance element and the second resistance element from a circuit of the first signal generator in accordance with a state of the first signal.

3. The semiconductor device according to claim 2,
wherein the switching element includes a transistor, and
wherein each of resistance values of the first resistance element and the second resistance element is larger than an on-resistance value of the transistor of the switching element, and a variation in each of the resistance values is smaller than a variation in the on-resistance value of the transistor.

4. The semiconductor device according to claim 3, wherein the first resistance element and the second resistance element include polysilicon.

5. The semiconductor device according to claim 1, wherein the second signal generator includes a second inverter array in which complementary-metal-oxide-semiconductor inverter sections are coupled in series.

6. The semiconductor device according to claim 1,
wherein the first signal generator includes a first inverter array in which complementary-metal-oxide-semiconductor inverter sections are coupled in series,
wherein the second signal generator comprises a second inverter array in which complementary-metal-oxide-semiconductor inverter sections are coupled in series,
wherein transistors in the first inverter array and transistors in the second inverter array include polysilicon-based lines, and
wherein a width of the lines of the transistors in the first inverter array is larger than a width of the lines of the transistors in the second inverter array.

7. The semiconductor device according to claim 1, wherein the detector includes a first sequential circuit section that outputs the plurality of second signals generated by the first signal generator when the third signal generated by the second signal generator changes from a first state to a second state.

8. The semiconductor device according to claim 7, wherein the detector includes a second sequential circuit section that outputs the plurality of second signals generated by the first signal generator when the third signal generated by the second signal generator changes from the second state to the first state.

9. The semiconductor device according to claim 8,
wherein the second signal generator includes:
a first circuit section including an inverter array in which an amount of change in delay in a p-channel transistor is larger than an amount of change in delay of an n-channel transistor; and
a second circuit section including an inverter array in which an amount of change in delay in an n-channel transistor is larger than an amount of change in delay of a p-channel transistor, and
wherein a signal is output from the first circuit section to the first sequential circuit section as the third signal, and a signal is output from the second circuit section to the second sequential circuit section as the third signal.

10. The semiconductor device according to claim 9, further comprising:
a controlled circuit that is controlled based on a signal output from the first sequential circuit section and a signal output from the second sequential circuit section.

11. The semiconductor device according to claim 10,
wherein the controlled circuit includes p-channel transistors coupled to a signal path and n-channel transistors coupled to the signal path, and
wherein the number of p-channel transistors that enter an on state is controlled based on a signal output from the first sequential circuit section, and the number of n-channel transistors that enter an on state is controlled based on a signal output from the second sequential circuit section.

12. The semiconductor device according to claim 11, wherein, based on an inverted signal of an input signal, the signal output from the first sequential circuit section, and the signal output from the second sequential circuit section, the on state and an off state of the p-channel transistors and the n-channel transistors are switched with a delay of a half cycle relative to a change in a state of the input signal.

13. The semiconductor device according to claim 10, wherein the controlled circuit comprises a plurality of controlled circuits.

14. The semiconductor device according to claim 7, further comprising a controlled circuit that is controlled based on a signal output from the first sequential circuit section.

15. The semiconductor device according to claim 14,
wherein the controlled circuit includes at least one delay circuit, and
wherein the number of delay circuits in a signal path is controlled based on a signal output from the first sequential circuit section.

16. The semiconductor device according to claim 14, wherein the controlled circuit includes:
a plurality of third resistance elements coupled in series; and
an element that is capable of terminating opposite ends of each of the third resistance elements, and
wherein the number of third resistance elements, the opposite ends of each thereof being terminated, is controlled based on a signal output from the first sequential circuit section.

17. The semiconductor device according to claim 14, wherein the controlled circuit includes a plurality of potential generating circuits coupled in parallel, and
wherein the number of potential generating circuits is controlled based on a signal output from the first sequential circuit section.

18. The semiconductor device according to claim 1, wherein a state of the first signal is changed a given number of times and is then fixed.

19. A signal adjusting method comprising the steps of:
generating second signals having states that change at different timings, in accordance with an operating state that changes by a first amount of change relative to a first signal;
generating a third signal in accordance with an operating state that changes by a second amount of change relative to the first signal;
detecting a delay amount based on the states of the second signals when a state of the third signal changes; and
adjusting a circuit for controlling the signal based on the delay amount, wherein the first signal is generated to have a smaller amount of change in delay relative to a change in the operating state than that of the second signals.

\* \* \* \* \*